US 8,219,955 B2

(12) United States Patent
Tsubamoto et al.

(10) Patent No.: US 8,219,955 B2
(45) Date of Patent: Jul. 10, 2012

(54) AUTOMATICALLY WIRING CIRCUIT BY SETTING AND CHANGING REFERENCE TO DESIGN QUALITY RELATING TO ELECTRIC CHARACTERISTIC

(75) Inventors: Daita Tsubamoto, Kawasaki (JP); Hitoshi Yokemura, Kawasaki (JP); Hidenobu Shiihara, Kawasaki (JP); Kazukiyo Ogawa, Kawasaki (JP); Hisashi Aoyama, Kawasaki (JP); Masaki Tosaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 413 days.

(21) Appl. No.: 12/574,084

(22) Filed: Oct. 6, 2009

(65) Prior Publication Data

US 2010/0030358 A1    Feb. 4, 2010

Related U.S. Application Data

(63) Continuation of application No. PCT/JP2007/060837, filed on May 28, 2007.

(51) Int. Cl.
*G06F 17/50* (2006.01)
(52) U.S. Cl. ......... 716/115; 716/111; 716/122; 716/126
(58) Field of Classification Search .................. 716/111, 716/115, 122, 126
See application file for complete search history.

(56) References Cited

U.S. PATENT DOCUMENTS

| 5,576,965 | A | 11/1996 | Akasaka et al. |
| 6,631,509 | B2 * | 10/2003 | Nakayama et al. ........... 716/122 |
| 7,065,480 | B2 | 6/2006 | Fujimori et al. |
| 7,280,953 | B2 | 10/2007 | Fujimori et al. |
| 7,322,019 | B2 * | 1/2008 | Sato et al. ...................... 716/112 |
| 7,325,218 | B2 * | 1/2008 | Katagiri ......................... 716/115 |
| 7,757,196 | B2 * | 7/2010 | Bird et al. ...................... 716/125 |
| 8,006,217 | B2 * | 8/2011 | Atsumi ......................... 716/126 |
| 2001/0041970 | A1 | 11/2001 | Fujimori et al. |
| 2001/0044709 | A1 | 11/2001 | Fujimori et al. |
| 2004/0168142 | A1 * | 8/2004 | Ishikawa et al. ................. 716/10 |
| 2005/0086621 | A1 | 4/2005 | Matsumura et al. |

(Continued)

FOREIGN PATENT DOCUMENTS

JP    1-292473    11/1989

(Continued)

OTHER PUBLICATIONS

T. Yamaguchi et al., "CAD System for Designing Communication Devices: TCAD", Fujitsu, vol. 50, No. 6, pp. 411-415, Nov. 1999.

(Continued)

*Primary Examiner* — Naum Levin
(74) *Attorney, Agent, or Firm* — Staas & Halsey LLP

(57) ABSTRACT

In order to make it possible to automatically execute a wiring process which satisfies not only a design condition but also design quality relating to an electric characteristic, according to the embodiment, an automatic wiring apparatus includes a design condition changing section for changing a design condition in accordance with priority information regarding the design condition where a wiring process which satisfies the design condition cannot be carried out by a first wiring processing section, a quality allowability decision section for deciding whether or not quality of a wiring region can be allowed where a wiring process which satisfies the design condition after the changing can be executed by a second wiring processing section and an outputting section for outputting a result of the wiring process of the wiring region by the second wiring processing section if it is decided that the quality of the wiring region can be allowed.

19 Claims, 19 Drawing Sheets

U.S. PATENT DOCUMENTS

| | | | |
|---|---|---|---|
| 2006/0168551 A1* | 7/2006 | Mukuno | 716/5 |
| 2008/0005708 A1* | 1/2008 | Sato et al. | 716/5 |
| 2009/0125507 A1* | 5/2009 | Shiihara et al. | 707/5 |

FOREIGN PATENT DOCUMENTS

| | | |
|---|---|---|
| JP | 2-21633 | 1/1990 |
| JP | 4-98900 | 3/1992 |
| JP | 6-89314 | 3/1994 |
| JP | 2000-227927 | 8/2000 |
| JP | 2002-92059 | 3/2002 |
| JP | 2002-259481 | 9/2002 |
| JP | 2004-172158 | 6/2004 |
| JP | 2005-122471 | 5/2005 |

OTHER PUBLICATIONS

International Search Report dated Jun. 19, 2007 for corresponding International Application No. PCT/JP2007/060837.

Japanese Patent Office Notice of Grounds of Rejection mailed Apr. 6, 2010, for corresponding Japanese Patent Application No. 2009-516096.

* cited by examiner

FIG. 4A

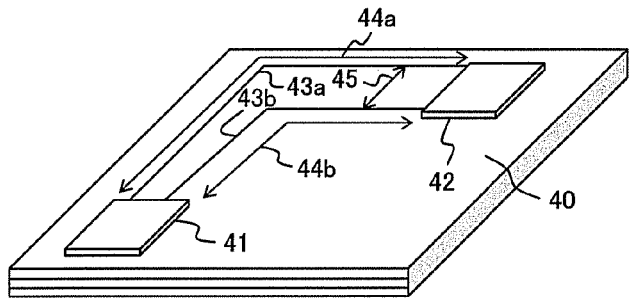

FIG. 4B

| ITEM | DESIGN CONDITION | MODERATION ALLOWABILITY INFORMATION | MODERATION CONTENTS |
|---|---|---|---|
| WIRING LENGTH 44a | 110mm | NG | — |
| WIRING LENGTH 44b | 100mm | NG | — |
| WIRING INTERVAL 45 | 0.5mm | OK | FIRST MODERATION: 0.4 mm →<br>SECOND MODERATION: 0.3 mm →<br>THIRD MODERATION: 0.2 mm |

| ITEM | DESIGN CONDITION | WIRING RESULT | MODERATION ALLOWABILITY INFORMATION | DISTRIBUTION OF POINTS | MARKING |
|---|---|---|---|---|---|
| WIRING LENGTH 44a | 110mm | 108mm | NG | 10 | 10 |
| WIRING LENGTH 44b | 100mm | 98mm | NG | 10 | 10 |
| WIRING INTERVAL 45 | 0.5mm | 0.2mm | OK | 4 | 2 |
| | | | | TOTAL POINTS | 22 |
| | | | | CRITERION | 22 |
| | | | | DECISION RESULT | OK |

51

| TRANSMISSION SPEED | 50Mbps | 100Mbps |
|---|---|---|
| RECOMMENDED trtf | 1ns | 0.5ns |
| WIRING INTERVAL | 0.25mm | 0.5mm |
| WIRING LENGTH | 200mm | 100mm |

FIG. 14

| ITEM | DESIGN CONDITION | WIRING RESULT | MODERATION ALLOWABILITY INFORMATION | DISTRIBUTION OF POINTS | MARKING |
|---|---|---|---|---|---|
| WIRING LENGTH | | | | | |
| WIRING INTERVAL | | | | | |
| LEADER WIRING LENGTH OF BYPASS CAPACITOR | | | | | |
| DISTANCE FROM TRANSMISSION DEVICE TO DAMPING RESISTOR | | | | | |
| DISTANCE FROM TRANSMISSION DEVICE TO BIAS RESISTOR | | | | | |
| BRANCHING WIRING LENGTH | | | | | |
| POWER SUPPLY WIRING LENGTH | | | | | |
| GND WIRING LENGTH | | | | | |

| NET NUMBER | CONNECTION DEVICE |
|---|---|
| 75a | TRANSMISSION DEVICE |
| 75a | RESISTOR |
| 75b | RESISTOR |
| 75b | RECEPTION DEVICE |

| NET NUMBER | TRANSMISSION DEVICE DETECTION | RECEPTION DEVICE DETECTION | RESISTOR DETECTION | DESIGN CONDITION NECESSITY | WARNING |
|---|---|---|---|---|---|
| 75a | ○ | × | ○ | NECESSARY | YES |
| 75a | × | ○ | ○ | UNNECESSARY | NO |

| NET NUMBER | MOUNTING INSTRUCTION FLAG | ACTUAL VALUE |
|---|---|---|
| 75a | NO | — |
| 75a | NO | — |

AUTOMATICALLY WIRING CIRCUIT BY SETTING AND CHANGING REFERENCE TO DESIGN QUALITY RELATING TO ELECTRIC CHARACTERISTIC

CROSS-REFERENCE TO RELATED APPLICATION

This application is a continuation Application of a PCT international application No. PCT/JP2007/060837 filed on May 28, 2007 in Japan, the entire contents of which are incorporated by reference.

FIELD

The embodiments discussed herein are related to a technique for automatically carrying out a wiring process in a wiring region of a wiring design target.

BACKGROUND

In recent years, the information processing amount required for digital electronic equipments is steadily increasing, and also the number of signal wirings in an equipment is increasing together with the increase of the information processing amount.

Therefore, much effort and time are required when a designer carries out a wiring process (wiring design) in a wiring region of a wiring design target such as an LSI, a printed board or the like by handwork, and a technique for automatically carrying out a wiring process (signal wiring) is required.

Thus, a technique is conventionally available wherein a wiring rule is produced based on information of parts connected in a net and automatic wiring is carried out in accordance with the wiring rule (refer to, for example, Japanese Patent Laid-Open No. 2000-227927; hereinafter referred to as Patent Document 1). An other technique is available wherein a design rule is determined using a sum total (evaluation cost) of critical are as determined from a plurality of layout data (refer to, for example, Japanese Patent Laid-Open No. 2004-172158; hereinafter referred to as Patent Document 2). A further technique is available wherein, where a constraint condition is not satisfied after disposition and wiring processes are automatically carried out, moderation information is added to the constraint condition and then it is decided again whether or not the constraint condition is satisfied (refer to, for example, Japanese Patent Laid-Open No. 2002-92059; hereinafter referred to as Patent Document 3).

SUMMARY

However, in such conventional techniques as disclosed in Patent Documents 1 to 3 specified above, a wiring process is not carried out while design quality relating to an electric characteristic regarding a wiring is decided. Therefore, there is the possibility that, even if a wiring process which satisfies a design condition is carried out, the design quality relating to the electric characteristic of the wiring region for which the wiring process is carried out may not be allowable.

Where the wiring region after the wiring process does not satisfy the design quality, the designer is obliged to change the design condition again to carry out the wiring process again, and this increases a burden on the designer.

Since the conventional techniques fail to set a reference to design quality relating to an electric characteristic in this manner, there is the possibility that, even if a wiring process is automatically carried out, a realistic result of wiring which satisfies the quality relating to the electric characteristic cannot be achieved. In this instance, the wiring process can be used only as temporary wiring for estimation of the number of layers.

According to an aspect of the embodiment, there is provided an automatic wiring apparatus for automatically carrying out a wiring process of a wiring region of a wiring design target based on design information and a design condition of the wiring region, comprising a first wiring processing section adapted to carry out a wiring process of the wiring region based on the design information and the design condition, a design condition changing section adapted to change the design condition in response to priority information regarding the design condition where a wiring process which satisfies the design condition cannot be carried out by the first wiring processing section, a second wiring processing section adapted to carry out a wiring process of the wiring region based on the design information and the design condition after the changing by the design condition changing section, a quality allowability decision section adapted to decide whether or not quality of the wiring region is allowable where a wiring process which satisfies the design condition after the changing can be executed by the second wiring processing section, and an outputting section adapted to output a result of the wiring process of the wiring region by the second wiring processing section where it is decided by the quality allowability decision section that the quality of the wiring region is allowable.

Preferably, the design condition changing section further changes the design condition after the changing in accordance with the priority information where the wiring process which satisfies the design condition after the changing cannot be executed by the second wiring processing section, and the second wiring processing section carries out, where the design condition after the changing is further changed by the design condition changing section, the wiring process of the wiring region based on the further changed design condition.

Preferably, the automatic wiring apparatus further comprises a priority information re-setting section adapted to re-set the priority information where it is decided by the quality allowability decision section that the quality of the wiring region is not allowable, and wherein the design condition changing section changes the design condition in accordance with the priority information re-set by the priority information re-setting section.

Preferably, the quality allowability decision section decides whether or not the quality of the wiring region is allowable based on the design condition and a result of the wiring process by the second wiring processing section in accordance with the design condition after the changing.

Preferably, the quality allowability decision section decides whether or not the quality of the wiring region is allowable based on a decision value calculated based on a reference value as the priority information set in advance for each item of the design condition and the result of the wiring process by the second wiring processing section.

Preferably, the automatic wiring apparatus further comprises a design condition production section adapted to produce the design condition based on a conversion table which indicates a corresponding relationship between a transmission speed of a signal between parts disposed in the wiring region and the design condition.

Preferably, at least one of the first wiring processing section and the second wiring processing section includes an installation-possible position extraction section adapted to extract installation-possible positions, in the wiring region, for a through-hole to be disposed in the wiring region, a wiring length calculation section adapted to calculate a wiring length of a wiring which passes through the through-hole provided at each of the installation-possible positions extracted by the installation-possible position extraction section, and an installation position determination section adapted to determine, as the installation position for the through-hole, the installation-possible position relating to the shortest wiring length from among the wiring lengths calculated by the wiring length calculation section.

Preferably, the automatic wiring apparatus further comprises a wiring inductance calculation section adapted to calculate wiring inductance based on a wiring length of a wiring relating to a by-pass capacitor disposed in the wiring region for which the wiring process is carried out by the second wiring processing section, and a noise amount calculation section adapted to calculate a noise amount based on the wiring inductance calculated by the wiring inductance calculation section and a power consumption variation amount of an integrated circuit, and wherein the quality allowability decision section decides whether or not the quality of the wiring region is allowable in response to the noise amount calculated by the noise amount calculation section.

Preferably, the automatic wiring apparatus further comprises a device information acquisition section adapted to acquire device information of a device connected to a net based on net list information as the design information, a design condition necessity decision section adapted to decide whether or not the design condition is necessary for the net based on the device information acquired by the device information acquisition section, a design condition presence decision section adapted to decide whether or not the design condition is set for the net for which it is decided by the design condition necessity decision section that the design condition is necessary, and a notification section adapted to issue, where it is decided by the design condition presence decision section that no design condition is set for the net, a notification of the decision.

Preferably, the automatic wiring apparatus further comprises a device information acquisition section adapted to acquire device information of a device connected to a net based on net list information as the design information, a design condition necessity decision section adapted to decide whether or not the design condition is necessary for the net based on the device information acquired by the device information acquisition section, a design condition presence decision section adapted to decide whether or not the design condition is set for the net for which it is decided by the design condition necessity decision section that the design condition is necessary, and a design condition setting section adapted to set, where it is decided by the design condition presence decision section that no design condition is set for the net, the design condition for the net.

Preferably, the automatic wiring apparatus further comprises a wiring region information setting section adapted to set wiring region information relating to the wiring region as the design information.

Preferably, the automatic wiring apparatus further comprises a priority information setting section adapted to set the priority information.

Preferably, the design condition changing section moderates the design condition stepwise in accordance with the priority information.

According to another aspect of the embodiment, there is provided an automatic wiring method for automatically carrying out a wiring process of a wiring region of a wiring design target based on design information and a design condition of the wiring region, comprising a first wiring processing step of carrying out a wiring process of the wiring region based on the design information and the design condition, a design condition changing step of changing the design condition in response to priority information regarding the design condition where a wiring process which satisfies the design condition cannot be carried out at the first wiring processing step, a second wiring processing step of carrying out a wiring process of the wiring region based on the design information and the design condition after the changing at the design condition changing step, a quality allowability decision step of deciding whether or not quality of the wiring region is allowable where a wiring process which satisfies the design condition after the changing can be executed at the second wiring processing step, and an outputting step of outputting a result of the wiring process of the wiring region at the second wiring processing step where it is decided at the quality allowability decision step that the quality of the wiring region is allowable.

Preferably, the automatic wiring method further comprises a first design condition re-changing step of further changing the design condition after the changing at the design condition changing step in accordance with the priority information where the wiring process which satisfies the design condition after the changing cannot be executed at the second wiring processing step, and a re-wiring processing step of carrying out, where the design condition after the changing is further changed at the design condition re-changing step, the wiring process of the wiring region based on the further changed design condition.

Preferably, the automatic wiring method further comprises a priority information re-setting step of re-setting the priority information where it is decided at the quality allowability decision step that the quality of the wiring region is not allowable, and a second design condition re-changing step of changing the design condition in accordance with the priority information re-set at the priority information re-setting step.

Preferably, at the quality allowability decision step, it is decided whether or not the quality of the wiring region is allowable based on the design condition and a result of the wiring process at the second wiring processing step in accordance with the design condition after the changing.

Preferably, at the quality allowability decision step, it is decided whether or not the quality of the wiring region is allowable based on a decision value calculated based on a reference value as the priority information set in advance for each item of the design condition and the result of the wiring process at the second wiring processing step.

According to a further aspect of the embodiment, there is provided an automatic wiring program for causing a computer to implement a function for automatically carrying out a wiring process of a wiring region of a wiring design target based on design information and a design condition of the wiring region, the automatic wiring program causing the computer to function as a first wiring processing section adapted to carry out a wiring process of the wiring region based on the design information and the design condition, a design condition changing section adapted to change the design condition in response to priority information regarding the design condition where a wiring process which satisfies the design condition cannot be carried out by the first wiring processing section, a second wiring processing section adapted to carry out a wiring process of the wiring region based on the design information and the design condition after the changing by the design condition changing section, a quality allowability decision section adapted to decide whether or not quality of the wiring region is allowable where a wiring process which satisfies the design condition after the changing can be executed by the second wiring processing section, and an outputting section adapted to output a result of the wiring process of the wiring region by the second wiring processing section where it is decided by the quality allowability decision section that the quality of the wiring region is allowable.

According to a still further aspect of the embodiment, there is provided a computer-readable recording medium on which the automatic wiring program described above is recorded.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 4A to 4C are views illustrating a basic function of the automatic wiring apparatus according to the embodiment, and wherein FIG. 4A illustrates the printed board and a wiring scheme of the wiring design target, FIG. 4B illustrates an example of a design condition, priority information and moderation contents of the wiring design target illustrated in FIG. 4A and FIG. 4C illustrates the priority information of the wiring design target illustrated in FIG. 4A and quality allowance decision by a quality allowability decision section;

FIGS. 8A and 8B are views illustrating an optimization function of a leader wiring for a by-pass capacitor implemented by an installation-possible position extraction section, a wiring length calculation section and an installation position determination section which are included in the first wiring processing section and/or the second wiring processing section of the automatic wiring apparatus according to the embodiment, and wherein FIG. 8A illustrates the by-pass capacitor, leader wiring and so forth before the optimization and FIG. 8B illustrates the by-pass capacitor, leader wiring and so forth after the optimization;

FIG. 14 is a view illustrating an example of a design condition retained in a design condition retention section of the automatic wiring apparatus according to the embodiment;

FIGS. 18A to 18D are views illustrating a check function of a design condition and a warning function implemented by a device information acquisition section, a design condition necessity decision section, a design condition presence decision section and a notification section of the automatic wiring apparatus according to the embodiment, and wherein FIG. 18A illustrates an example of a net for acquiring device information, FIG. 18B illustrates an example of acquired device information, FIG. 18C illustrates a process by the design condition necessity decision section and FIG. 18D illustrates an example of a design condition for the net illustrated in FIG. 18A.

DESCRIPTION OF REFERENCE CHARACTERS

Figure 1:
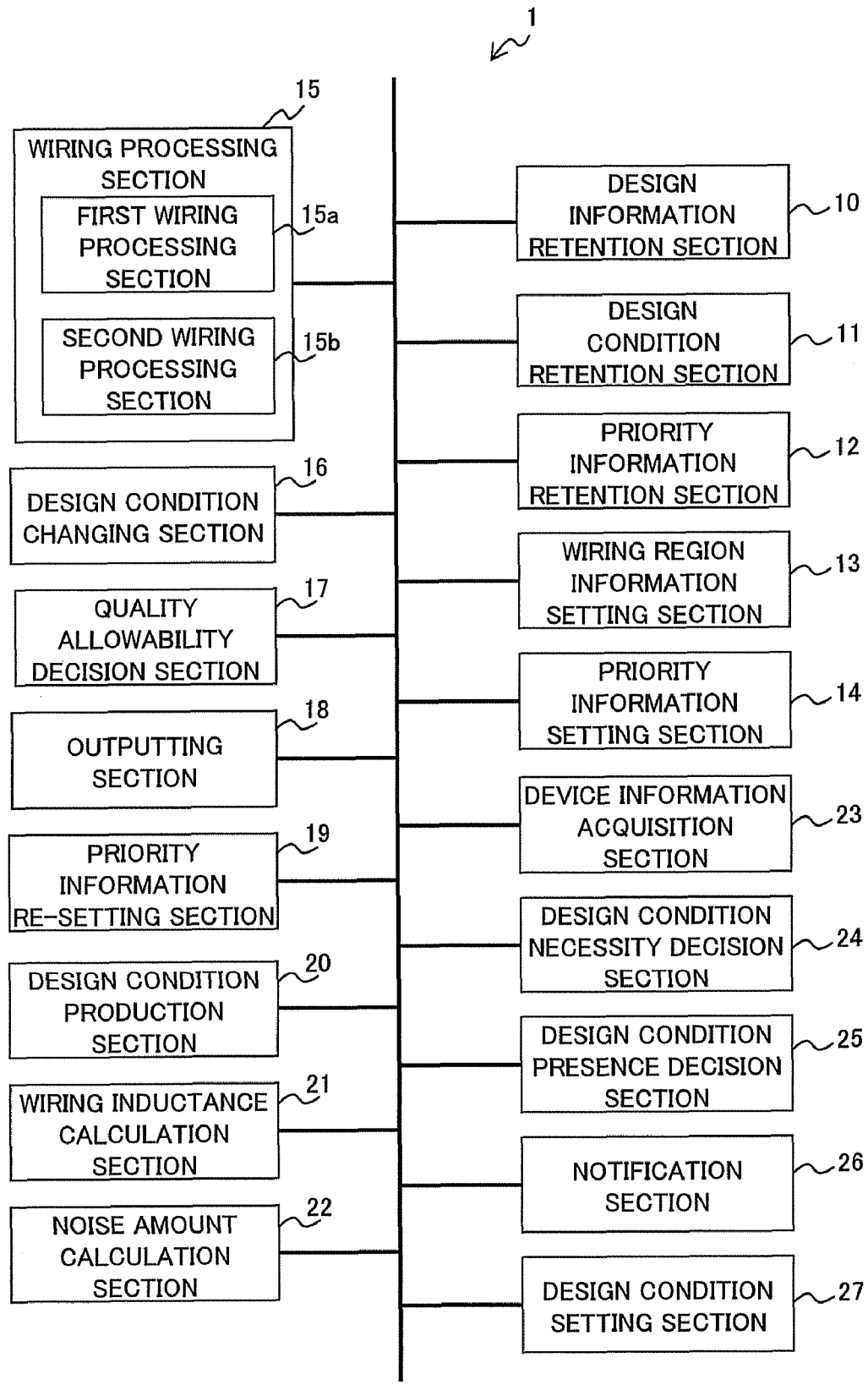
FIG. 1 is a block diagram illustrating a configuration of an automatic wiring apparatus according to an embodiment.

1 Automatic wiring apparatus
10 Design information retention section
11 Design condition retention section
12 Priority information retention section
13 Wiring region information setting section
14 Priority information setting section
15 Wiring processing section
15a First wiring processing section
15b Second wiring processing section
15c Installation-possible position extraction section
15d wiring length calculation section
15e Installation position determination section
16 Design condition changing section
17 Quality allowability decision section
18 Outputting section
19 Priority information re-setting section
20 Design condition production section 20a Conversion table
21 Wiring inductance calculation section
22 Noise amount calculation section
23 Device information acquisition section
24 Design condition necessity decision section
25 Design condition presence decision section
26 Notification section
27 Design condition setting section
30 Computer
31 Monitor
32 Keyboard
33 Mouse
34 Arithmetic section (CPU)
35 Storage apparatus
40, 62 Printed Board (wiring design target; wiring region)
41, 42 Components
43a, 43b Wiring
44a, 44b Wiring length
45 Wiring interval
52a~c By-pass capacitor
53a, 53d, 55a, 71a, 72a Through-hole (via)
53b, 53c, 53e Leader wiring
54 Installation target region
55b, 57a~c, 58a~c Wiring
56a, 56b solder pads
63 LSI (Large Scale Integration; integrated circuit)
65a, 68a, 73a Reception device
65b, 68b, 73b Transmission device
66, 74 Damping resistor
67, 68c, 69c, 69d, 71b, 72b, 75a, 75b Connection wiring
69a Bias resistor
69b Connection point
70 IC (integrated circuit)

DESCRIPTION OF THE PREFERRED EMBODIMENT

In the following, an embodiment is described with reference to the drawings.

[1] Embodiment

First, a configuration of an automatic wiring apparatus (hereinafter referred to as present automatic wiring apparatus) 1 as an embodiment is described with reference to a block diagram illustrated in FIG. 1.

Referring to FIG. 1, the present automatic wiring apparatus 1 automatically carries out a wiring process for a wiring region which is a wiring design target (for example, an LSI or a printed board) based on design information and a design condition of the wiring region and includes a design information retention section 10, a design condition retention section 11, a priority information retention section 12, a wiring region information setting section 13, a priority information setting section 14, a wiring processing section 15, a design condition changing section 16, a quality allowability decision section 17, an outputting section 18, a priority information re-setting section 19, a design condition production section 20, a wiring inductance calculation section 21, a noise amount calculation section 22, a device information acquisition section 23, a design condition necessity decision section 24, a design condition presence decision section 25, a notification section 26 and a design condition setting section 27.

Figure 2:
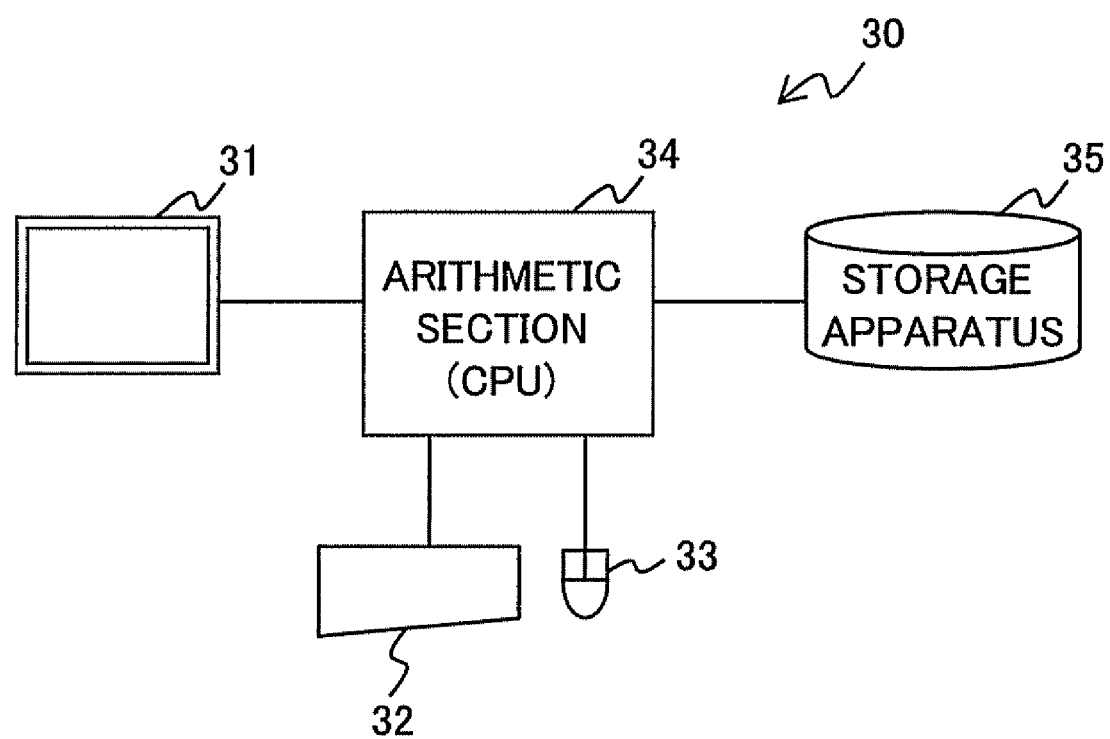
FIG. 2 is a block diagram illustrating an example of a configuration of a computer in which the automatic wiring apparatus according to the embodiment is implemented.

Here, the present automatic wiring apparatus 1 is implemented by such a computer 30 as illustrated in FIG. 2 which includes an arithmetic section (for example, a CPU: Central Processing Unit) 34 to which a monitor 31, a keyboard 32 and a mouse 33 are connected, and a storage apparatus 35 connected to the arithmetic section 34.

In particular, the wiring region information setting section 13, priority information setting section 14, wiring processing section 15 (which includes a first wiring processing section 15a, a second wiring processing section 15b, an installation-possible position extraction section 15c, a wiring length calculation section 15d and an installation position determination section 15e which are hereinafter described), design condition changing section 16, quality allowability decision section 17, outputting section 18, priority information re-setting section 19, design condition production section 20, wiring inductance calculation section 21, noise amount calculation section 22, device information acquisition section 23, design condition necessity decision section 24, design condition presence decision section 25, notification section 26 and design condition setting section 27 are implemented by execution of a predetermined application program (automatic wiring program hereinafter described) by the arithmetic section 34.

Then, the design information retention section 10, design condition retention section 11 and priority information retention section 12 are implemented by a memory (not shown) included in the storage section 35 or the arithmetic section 34 of the computer 30.

[1-1] Basic Function of the Present Automatic Wiring Apparatus 1

Here, basic functions (that is, details of the design information retention section 10, design condition retention section 11, priority information retention section 12, wiring region information setting section 13, priority information setting section 14, wiring processing section 15, design condition changing section 16, quality allowability decision section 17, outputting section 18 and priority information re-setting section 19) of the present automatic wiring apparatus 1 are described with reference to FIG. 1.

The design information retention section 10 retains design information of a design target (wiring design target). Here, the design information includes wiring region information regarding the size, the number of layers (maximum value of the number of layers) and so forth of a wiring region which is the wiring design target, disposition information of parts to be disposed in the wiring region, a net list (net list information) which is interconnection information of the parts and so forth.

The design condition retention information section 11 retains a design condition. Here, the design condition is information regarding constraint to be kept in the wiring process and is, for example, a condition of a wiring length or a condition of a wiring interval. It is to be noted that details of the design condition are described in the description hereinafter given with reference to FIG. 4B and FIG. 14.

The priority information retention section 12 retains priority information regarding the design information. Here, the priority information is information which represents a priority degree of each item (for example, a wiring length or a wiring interval) of the design condition, and particularly, as hereinafter described with reference to FIGS. 4B and 4C, the priority information is information (moderation allowability information) representative of whether or not the design condition should be made a target of condition moderation by the design condition changing section 16, information representative of distribution of points to an item to be used by the quality allowability decision section 17, or information representative of an order of the items in which the priority should be applied (particularly, an order of the items in which the condition moderation is to be carried out by the design condition changing section 16).

Figure 3:
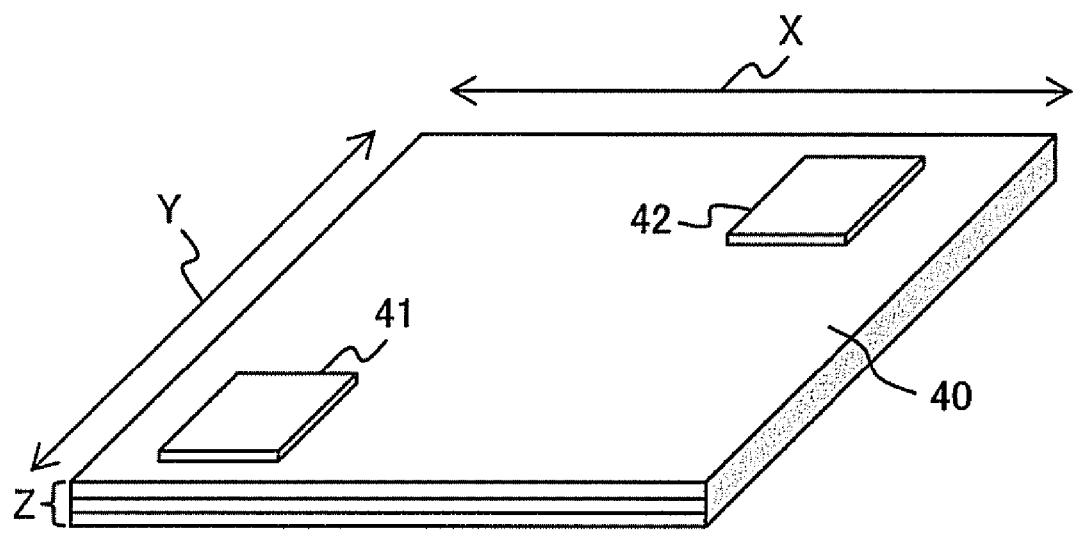
FIG. 3 is a view illustrating a printed board as a wiring design target of the automatic wiring apparatus according to the embodiment.

The wiring region information setting section 13 sets wiring region information (a size, a number of layers and so forth of a wiring region) regarding the wiring region as the design information. For example, the wiring region information setting section 13 registers the wiring region information into the design information retention section 10 in response to an instruction of the designer (operator) inputted thereto through an inputting interface such as, for example, the keyboard 32, the mouse 33 or the like. For example, as illustrated in FIG. 3, the wiring region information setting section 13 registers a transverse size X and a longitudinal size Y of a printed board 40 and a number Z of layers of the printed board 40 as the wiring region inputted by the operator into the design information retention section 10. It is to be noted that parts 41 and 42 are disposed on the printed board 40. Further, the number Z of the layers may be set as a maximum value in view of the thickness and the cost of the printed board 40.

The priority information setting section 14 sets priority information and particularly registers the priority information into the priority information retention section 12 in accordance with an instruction of the operator inputted thereto through an inputting interface such as, for example, the keyboard 32, the mouse 33 or the like.

The wiring processing section 15 automatically executes a wiring process of a wiring region based on the design information retained in the design information retention section 10, the design condition retained in the design condition retention section 11 and the priority information retained in the priority information retention section 12 and includes a first wiring processing section 15a and a second wiring processing section 15b.

The first wiring processing section 15a carries out a wiring process (primary wiring process) of the wiring region based on the design information retained in the design information retention section 10 and the design condition retained in the design condition retention section 11.

The second wiring processing section 15b carries out another wiring process (secondary wiring process) of the wiring region based on the design information retained in the design information retention section 10 and a design condition changed by the design condition changing section 16 where the first wiring processing section 15a cannot carry out the wiring process which satisfies the design condition retained in the design condition retention section 11.

In particular, although the first wiring processing section 15a carries out the wiring process using the design condition retained in the design condition retention section 11 as it is, the second wiring processing section 15b carries out the wiring process of the wiring region based on the design condition moderated by the design condition changing section 16 where a wiring process which satisfies the design condition cannot be executed by the first wiring processing section 15a.

Further, if the wiring process in accordance with the design condition after the changing by the design condition changing section 16 cannot be carried out and the design condition after the changing is further changed by the design condition changing section 16, then the second wiring processing section 15b carries out the wiring process based on the further changed design condition. In this manner, every time the design condition is changed by the design condition changing section 16, the second wiring processing section 15b executes the wiring process in accordance with the changed design condition.

The design condition changing section 16 changes (moderates) the design condition stepwise in response to the priority information regarding the design condition and retained in the priority information retention section 12 where the first wiring processing section 15a cannot carry out the wiring process which satisfies the design condition.

For example, a case is described wherein the present automatic wiring apparatus 1 carries out the wiring process for wirings 43a and 43b between the parts 41 and 42 on the printed board 40 as the wiring region illustrated in FIG. 4A.

At this time, for example, a design condition illustrated in a table 50 of FIG. 4B is retained in the design condition retention section 10. In particular, a design condition is set that a wiring length 44a of the wiring 43a is "110 mm", a wiring length 44b of the wiring 43b is "100 mm" and a wiring interval 45 between the wirings 43a and 43b is "0.5 mm".

Further, moderation allowability information (flag) which indicates whether or not condition changing (moderation) by the design condition changing section 16 can be allowed is set as the priority information for each item. Here, the moderation allowability information of the wiring length 44a of the wiring 43a and the wiring length 44b of the wiring 43b indicates "NG" but the moderation allowability information of the wiring interval between the wirings 43a and 43b indicates "OK".

Also concrete moderation contents which indicate stepwise condition moderation of the wiring interval where the moderation allowability information indicates "OK" are set. Here, the first moderation is "0.4 mm", the second moderation is "0.3 mm" and the third moderation is "0.2 mm". The moderation contents may be inputted by the operator or may be set in advance in accordance with the design condition. Further, the moderation contents may be retained in the design condition retention section 11 or in the design condition changing section 16.

Further, it is preferable to display the table 50 of FIG. 4B on the monitor 31.

Then, the design condition changing section 16 changes (here, moderates) the design condition regarding the wiring interval 45 in accordance with the moderation allowability information as the priority information illustrated in FIG. 4B where the wiring process for the wirings 43a and 43b which satisfies the design condition is not completed by the first wiring processing section 15a.

At this time, the design condition changing section 16 moderates the design condition regarding the wiring interval 45 stepwise from the first moderation in response to the moderation contents. Here, the design condition regarding the wiring interval 45 is changed to "0.4 mm" first.

Consequently, the second wiring processing section 15b executes the wiring process for the wirings 43a and 43b of the printed board 40 again based on the design condition wherein the wiring interval 45 is changed to "0.4 mm".

Further, as described above, where the wiring process which satisfies the design condition after the changing (design condition wherein the wiring interval 45 is "0.4 mm") cannot be executed by the second wiring processing section 15b, the design condition changing section 16 further changes the design condition after the changing in accordance with the moderation allowability information as the priority information. Here, the design condition changing section 16 changes the design condition regarding the wiring interval 45 to "0.3 mm" of the second moderation.

In this manner, where the wiring process which satisfies the design condition cannot be executed by the first and second wiring processing sections 15a and 15b, the design condition changing section 16 changes the design condition in accordance with the priority information and the moderation contents until the wiring process which satisfies the design condition is completed or no moderation contents remain anymore (here, until the wiring interval 45 is set to "0.2 mm").

Further, if the priority information is re-set by the priority information re-setting section 19, then the design condition changing section 16 changes the design condition in accordance with the re-set priority information.

It is to be noted that the design condition changing section 16 may include a function for deciding whether or not the wiring process which satisfies the design condition is carried out by the first and second wiring processing sections 15a and 15b (that is, whether or not the wiring process by the first and second wiring processing sections 15a and 15b is completed to the end). In this instance, after the wiring process by the first and second wiring processing sections 15a and 15b, the design condition changing section 16 first carries out the decision described above and then changes the design condition in accordance with a result of the decision.

The quality allowability decision section 17 decides whether or not the quality of the wiring region can be allowed where the wiring process which satisfies the design condition after the changing by the design condition changing section 16 can be executed by the second wiring processing section 15b, and decides whether or not wiring region sound quality can be allowed based on the initial design condition and the result of the wiring process by the second wiring processing section 15b.

The wiring process executed by the second wiring processing section 15b is based on the moderated design condition and there is the possibility that the wiring process may not satisfy the predetermined design quality. Therefore, the quality allowability decision section 17 collects information by what degree each item is moderated with respect to the design condition by the design condition changing section 16 from a result of the wiring and carries out marking in accordance with the distribution of points set in advance for each item. Then, the quality allowability decision section 17 calculates the sum total of the marking results of the items and compares the calculated sum total with a criterion set in advance to carry out an allowability decision of the quality.

In particular, as illustrated in the table 51 of FIG. 4C, the quality allowability decision section 17 decides, based on the marking (decision value) calculated based on the distribution of points (reference value) as the priority information set in advance for each item of the design condition and the result (wiring result) of the wiring process by the second wiring processing section 15b, whether or not the quality regarding an electric characteristic of the printed board 40 as the wiring region can be allowed by comparing the marking with the criterion set in advance.

In particular, as illustrated in the table 51 of FIG. 4C, the distribution of points according to the priority is set in advance as the priority information for the items of the design condition. Here, the distribution of points to the wiring lengths 44a and 44b whose priority is high (that is, whose moderation allowability information indicates "NG") is set high (here, to "10"). On the other hand, the distribution of points to the wiring interval 45 whose priority is low (that is, whose moderation allowability information indicates "OK") is set low (here, "4").

Then, the quality allowability decision section 17 calculates marking with respect to the distribution of points in response to the wiring result with respect to the design condition and carries out, for example, regarding the wiring interval 45 whose design condition is moderated, marking in response to the number of moderation stages based on the moderation contents. Here, since the design condition regarding the wiring interval 45 is moderated to "0.3 mm" of the second moderation, the marking is "2" with respect to the distribution of points "4".

It is to be noted that the quality allowability decision section 17 applies a marking of "10" of the perfect score with respect to the "10" distribution points to the wiring lengths 44a and 44b for which the wiring process which satisfies the design condition is carried out without moderating the design condition.

Then, the quality allowability decision section 17 compares "22" of the total point of a result of the marking and "22" of the allowance criterion (criterion) according to the distribution of points of the design condition with each other. Here, since the total point is higher than the allowance criterion, it is decided that the design condition regarding the quality of the electric characteristic regarding the wiring lengths 44a and 44b and the wiring interval 45 of the wiring region (printed board) 40 is satisfied (it is decided that a result of the decision is "OK").

On the other hand, for example, if the design condition regarding the wiring interval 45 is moderated to "0.2 mm" of the third moderation and the marking of the wiring interval 45 is changed to "1" and then the marking result is calculated as "21" (particularly, where the total point is lower than the allowance criterion), then the quality allowability decision section 17 decides that the design condition regarding the quality of the electric characteristic of the wiring region (printed board) 40 is not satisfied (decides that the decision result is "NG").

It is to be noted that preferably the table 51 of FIG. 4C is displayed on the monitor 31.

If it is decided by the quality allowability decision section 17 that the quality of the wiring region 40 is allowed, then the outputting section 18 displays the result of the wiring process of the wiring region 40 by the second wiring processing section 15b, for example, on the monitor 31 and outputs the wiring processing result to the outside of the present automatic wiring apparatus 1.

Further, where the wiring process of the wiring region 40 is completed by the first wiring processing section 15a, the outputting section 18 outputs also the result of this wiring process to the outside.

Further, where the priority information is not re-set by the priority information re-setting section 19 and the wiring process wherein the quality is allowed by the quality allowability decision section 17 cannot be executed based on the design information and the design condition by the wiring processing section 15, the outputting section 18 outputs a result of the process as an error notification to the outside.

If it is decided by the quality allowability decision section 17 that the quality of the wiring region cannot be allowed, then the priority information re-setting section 19 re-sets the priority information retained by the priority information retention section 12. In particular, the priority information re-setting section 19 changes the moderation allowability information of the wiring length 44a or the wiring length 44b illustrated in FIG. 4(c) to "OK" or changes the distribution of points to re-set the priority information.

Then, an operation procedure (automatic wiring method as the embodiment of the present invention) of the basic configuration described above of the present automatic wiring apparatus 1 is described with reference to FIG. 5.

It is to be noted that details of the design condition production section 20, wiring inductance calculation section 21, noise amount calculation section 22, device information acquisition section 23, design condition necessity decision section 24, design condition presence decision section 25, notification section 26 and design condition setting section 27 are described in an item of "[1-2] Other Functions of the Automatic Wiring Apparatus 1" hereinafter described.

Figure 5:
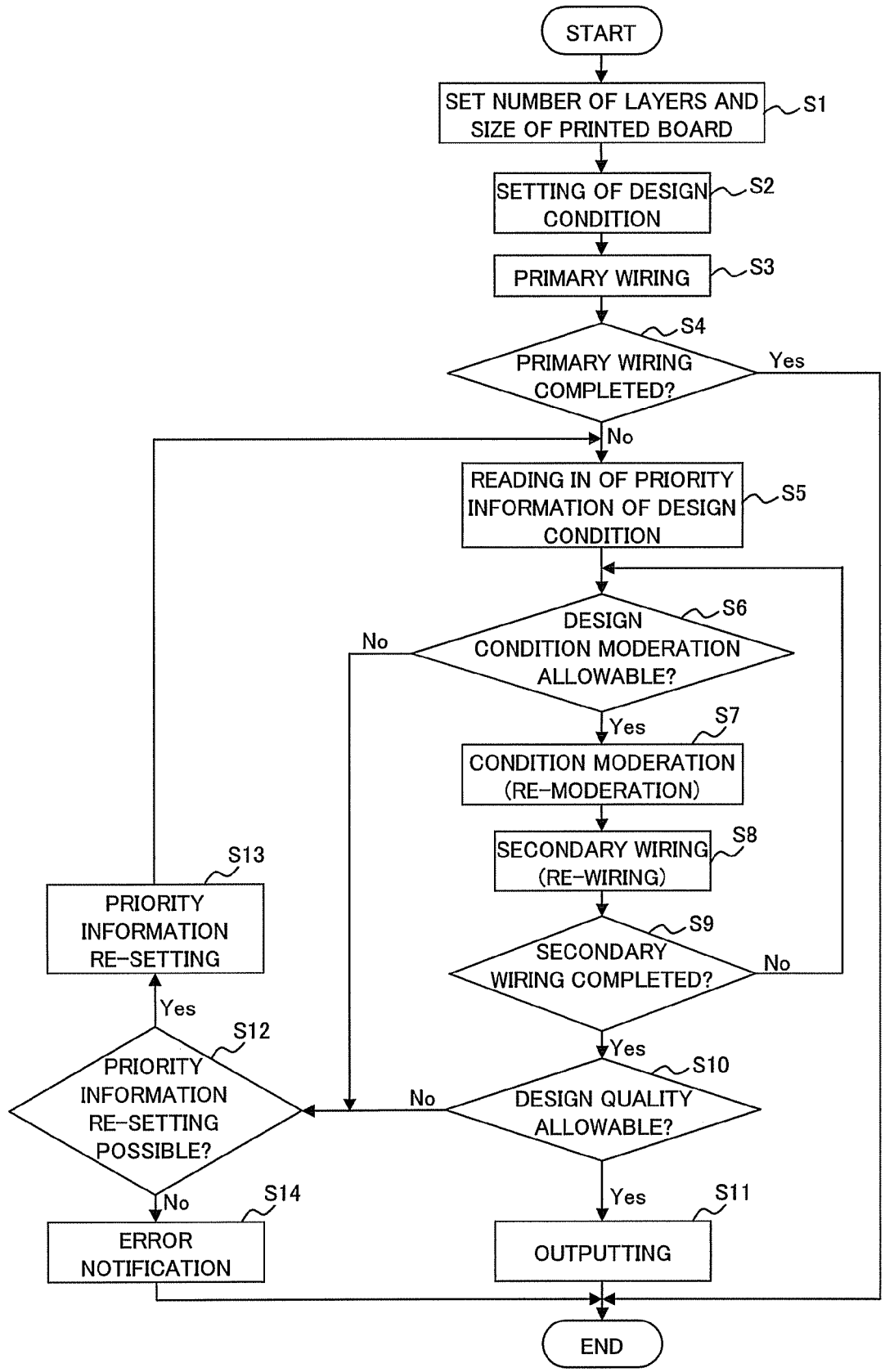
FIG. 5 is a flow chart illustrating an operation procedure of an automatic wiring method as the embodiment.

As illustrated in a flow chart (steps S1 to S14) of FIG. 5, the wiring region information setting section 13 first sets, as design information, a number of layers and a size (wiring region information) of a printed board as a wiring region based on information inputted by the operator through the keyboard 32, the mouse 33 or the like (design information setting step; step S1).

Then, a design condition which is limitations regarding a wiring length, a wiring interval and so forth is set by the inputting by the operator through the keyboard 32, the mouse 33 or the like, or by the design condition production section 20 or the design condition setting section 27 (design condition setting step; step S2).

Then, the first wiring processing section 15a carries out a primary wiring process for the wiring region based on the design information including the wiring region information, part disposition information, net list and so forth set at step S1 by the wiring region setting section 13 and the design condition set at step S2 (first wiring processing step; step S3).

Then, if the primary wiring process, which satisfies the design condition, by the first wiring processing section 15a is completed (Yes route of step S4), then the present automatic wiring apparatus 1 ends the processing.

On the other hand, for example, if the design condition is satisfied while all signal lines cannot be wired and the primary wiring process is not completed (No route of step S4), then the design condition changing section 16 reads in the priority information of the design condition retained in the priority information retention section 12 (step S5).

Then, the design condition changing section 16 decides whether or not changing (moderation) of the design condition is possible based on the read-in priority information (particularly, the moderation contents) (step S6).

Here, if it is decided that moderation of the design condition is possible (Yes route of step S6), then the design condition changing section 16 moderates the design condition in accordance with the read-in priority information (design condition changing step; step S7).

At this time, for example, in an example illustrated in FIGS. 4A to 4C, the design condition changing section 16 moderates, as the first condition moderation, the design condition regarding the wiring interval 45 from "0.5 mm" to "0.4 mm" in accordance with the moderation contents.

Then, the second wiring processing section 15b executes a secondary wiring process based on the design information and the design condition changed by the design condition changing section 16 at step S7 (second wiring processing step; step S8). If the secondary wiring process which satisfies the design condition after the changing is completed by the second wiring processing section 15b (Yes route of step S9), then the quality allowability decision section 17 decides whether or not the quality of the wiring region for which the secondary wiring process is carried out can be allowed as described above with reference to FIG. 4(c) (quality allowability decision step; step S10).

Here, if it is decided by the quality allowability decision section 17 that the quality can be allowed (Yes route of step S10), then the outputting section 18 outputs a result of the wiring process executed by the second wiring processing section 15b at step S8 to the outside (outputting step; step S11), and then the present automatic wiring apparatus 1 ends the processing.

On the other hand, if the secondary wiring process which satisfies the design condition after the changing is not completed by the second wiring processing section 15b (No route of step S9), then a first design condition re-changing step for further changing the design condition after the changing in accordance with the priority information (step S7) is executed by the design condition changing section 16 and then the processing returns to step S6 in order to execute the secondary wiring process (re-wiring processing step; step S8) again based on the further changed design condition.

However, if it is decided after the returning from the process at step S9 described above or after the process at step S5 described above by the design condition changing section 16 that moderation of the design condition cannot be carried out (No route of step S6), then the processing advances to a process (step S12) by the priority information re-setting section 19.

Here, it is decided by the design condition changing section 16 that the design condition cannot be moderated in a case wherein, for example, the design condition regarding the wiring interval 45 in the example illustrated in FIG. 4B is moderated to the third moderation "0.2 mm" at the last stage and therefore the design condition regarding the item of the wiring interval 45 cannot be moderated further while also the design condition regarding the other items (here, the wiring lengths 44a and 44b) cannot be moderated.

Further, also where it is decided from a result of the decision (step S10) of the quality allowability by the quality allowability decision section 17 that, while the wiring process is completed in accordance with the design condition after the changing by the second wiring processing section 15b, the design quality cannot be allowed depending upon the wiring process (No route of step S10), the processing advances to the process (step S12) by the priority information re-setting section 19.

Then, the priority information re-setting section 19 first decides whether or not the priority information retained in the priority information retention section 12 can be re-set (step S12).

For example, the priority information re-setting section 19 decides whether or not the priority information can be re-set based on information indicative of whether or not some other priority information regarding the same design condition is retained in the priority information retention section 12 or information indicative of whether or not new priority information is inputted by the operator through the keyboard 32 or the mouse 33.

Here, if it is decided, from the information indicating that some other priority information is retained in the priority information retention section 12 or the information indicating that new priority information is inputted by the operator, by the priority information re-setting section 19 that the priority information can be re-set (Yes route of step S12), then the priority information re-setting section 19 re-sets the other priority information retained in the priority information retention section 12 or the new priority information inputted by the operator as the priority information for the design condition set at step S2 described above (priority information re-setting step; step S13).

Then, the design condition set at step S2 described above is changed by the design condition changing section 16 based on the re-set priority information (second design condition re-changing step; step S7), and the processing advances to the process at step S5 described above after the process at step S13 described above in order to cause the second wiring processing section 15b to execute a re-wiring process (step S8) based on the design condition after the changing.

On the other hand, if it is decided, from information that no different priority information is retained by the priority information retention section 12 or from information that no new priority information is inputted by the operator, by the priority information re-setting section 19 that the priority information cannot be re-set (No route of step S12), then the outputting section 18 outputs, as an error notification, a result of the process that the wiring process with which the quality can be allowed cannot be executed by the quality allowability decision section 17 based on the design information set at step S1 described above to the outside (step S14), and then the present automatic wiring apparatus 1 ends the processing.

In this manner, with the present automatic wiring apparatus 1, also in the case wherein the wiring process is not completed by the first wiring processing section 15a based on the design condition set in advance, the design condition changing section 16 can change the design condition based on the priority information such that the second wiring processing section 15b carries out the wiring process based on the design condition after the changing. Further, where the wiring process by the second wiring processing section 15b is completed, in the wiring process by the second wiring processing section 15b, the design condition is moderated from the initial state and there is the possibility that the wiring process may not satisfy the quality of the electric characteristic. Therefore, the quality allowability decision section 17 decides whether or not the quality is satisfied, and, only where it is decided that the quality is satisfied, the outputting section 18 outputs a result of the wiring process by the second wiring processing section 15b as a regular wiring process result. Consequently, the wiring process which satisfies the design quality regarding the electric characteristic can be automatically executed while satisfying the predetermined design condition.

[1-2] Other Functions of the Automatic Wiring Apparatus 1

Now, other functions of the present automatic wiring apparatus 1 (in particular, details of the design condition production section 20, wiring inductance calculation section 21, noise amount calculation section 22, device information acquisition section 23, design condition necessity decision section 24, design condition presence decision section 25, notification section 26 and design condition setting section 27) are described with reference to FIG. 1.

[1-2-1] Automatic Calculation Function of the Design Condition

First, an automatic calculation function of a design condition implemented by the design condition production section 20 of the present automatic wiring apparatus 1 is described.

The design condition production section 20 automatically produces a design condition and registers the produced design condition into the design condition retention section 11 based on a conversion table 20a (refer to FIG. 6 hereinafter described) which indicates a corresponding relationship between a transmission speed of a signal between parts disposed in the wiring region and the design condition.

A wiring length and a wiring interval as the design condition can be calculated based on rise time/fall time (trtf). Further, since the rise time/fall time corresponds to the transmission speed of the signal, the rise time/fall time can be estimated from the transmission speed.

Incidentally, while normally the transmission speed of the signal between parts is included in design information or is defined in advance at a preceding step to the wiring process, there is the possibility that the rise time/fall time may not be defined in advance depending upon a part (signal). In this instance, conventionally the rise time/fall time need be estimated in order to determine the wiring length and the wiring interval as the design condition, and much time is required for the estimation of the rise time/fall time.

Figure 6:
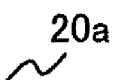
FIG. 6 is a view illustrating a conversion table retained by a design condition production section of the automatic wiring apparatus according to the embodiment.

Therefore, the design condition production section 20 retains the conversion table 20a, which indicates a corresponding relationship among the transmission speed, rise time/fall time (estimation trtf) and design condition (here, the wiring interval and the wiring length) as illustrated in FIG. 6, into a memory (not shown) or the like thereof and automatically produces the design condition from the transmission speed using the conversion table 20a.

For example, where a transmission speed of a signal regarding the wiring 43a between the parts 41 and 42 described herein above with reference to FIG. 4A is "100 ns", based on the conversion table 20a, the design condition production section 20 sets the wiring interval between the wirings 43a and 43b to "0.5 mm" and sets the wiring length of the wiring 43a to "100 mm".

In this manner, with the design condition production section 20, the time required for estimation of the rise time/fall time using the transmission speed can be omitted and also the time required for estimation of the design condition using the rise time/fall time can be omitted. Consequently, the time required for setting of the design condition can be reduced significantly and the working burden on the operator can be decreased significantly.

It is to be noted that, by producing in advance the conversion table 20a by the operator having expert technical knowledge, the design quality of all wiring regions for which the wiring process is carried out using the conversion table 20a can be made uniform while desired quality is maintained.

[1-2-2] Optimization (Retouching) Function of a Leader Wiring of a By-pass Capacitor Then, an optimization (retouching) function of a leader wiring of a by-pass capacitor implemented by the first wiring processing section 15a and the second wiring processing section 15b of the wiring processing section 15 of the present automatic wiring apparatus 1 is described. It is to be noted that the by-pass capacitor is connected to an IC (Integrated Circuit) and suppresses noise to stabilize the IC. Therefore, from a point of view of noise suppression which is an item of the electric characteristic, it is desired to make the leader wiring of the by-pass capacitor as short as possible.

Figure 7:
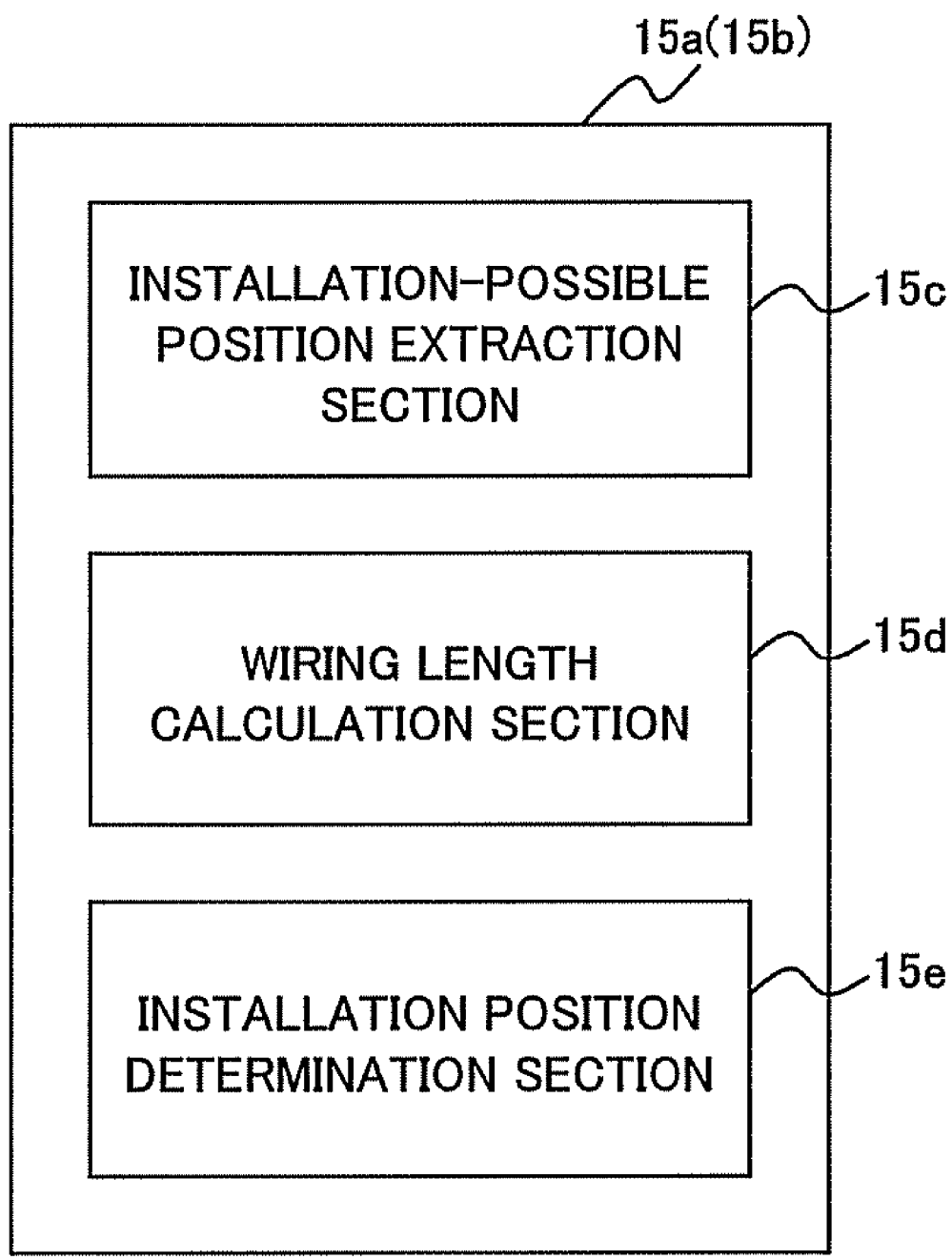
FIG. 7 is a block diagram illustrating a configuration of a first wiring processing section and/or a second wiring processing section of a wiring processing section of the automatic wiring apparatus according to the embodiment.

Therefore, in order to optimize the length of the leader wiring of the by-pass capacitor to the shortest, the first wiring processing section 15a and the second wiring processing section 15b individually include an installation-possible position extraction section 15c, a wiring length calculation section 15d and an installation position determination section 15e as illustrated in FIG. 7.

It is to be noted that at least one of the first wiring processing section 15a and the second wiring processing section 15b may include the installation-possible position extraction section 15c, wiring length calculation section 15d and installation position determination section 15e.

Figure 8A:
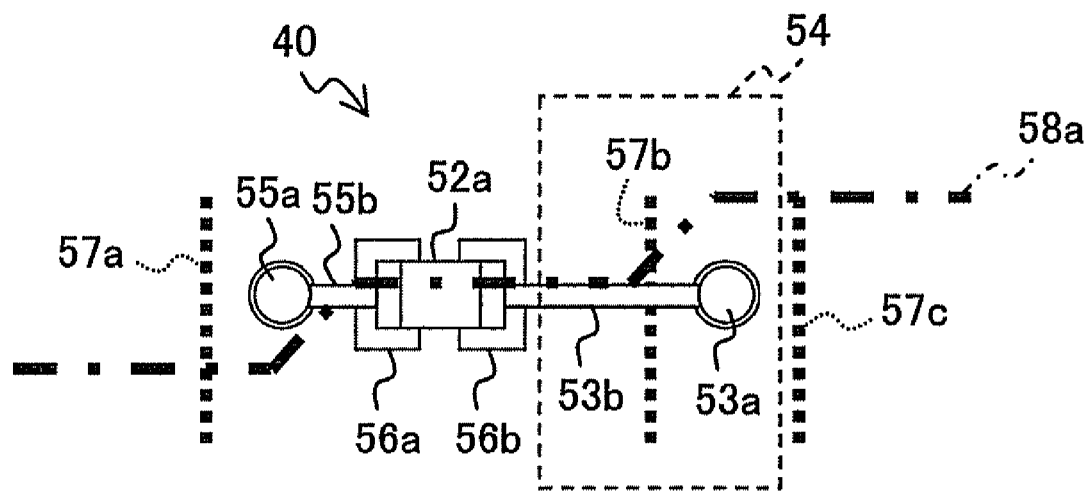
Figure 8B:
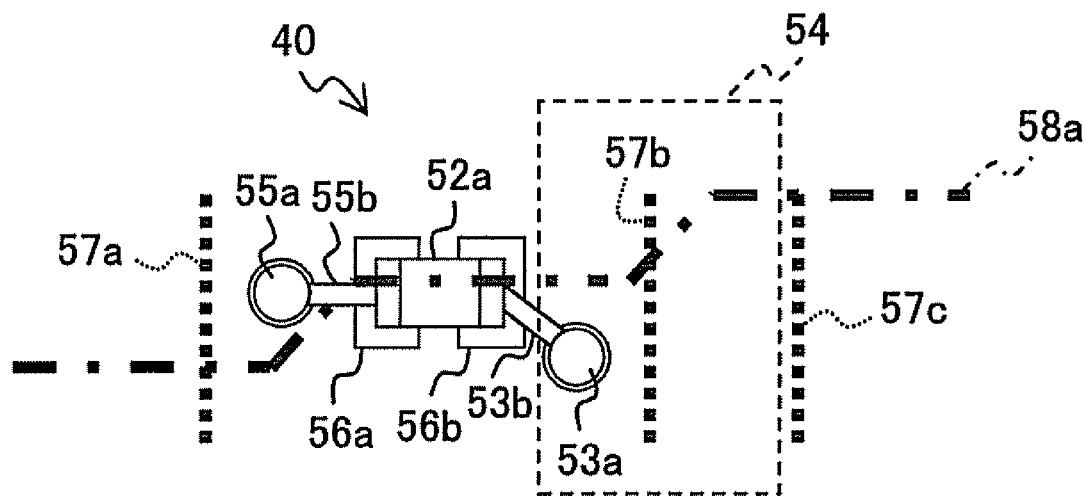

For example, as illustrated in FIGS. 8A and 8B, the installation-possible position extraction section 15c extracts an installation-possible position, in a predetermined installation target region 54 of the wiring region 40, of a through-hole (via) 53a for connection of a by-pass capacitor 52a provided in the wiring region 40 to the ground (GND).

It is to be noted that, in FIGS. 8A and 8B, reference character 53b denotes a leader wiring which passes through the through-hole 53a for the by-pass capacitor 52a, 55a a through-hole for connection of the by-pass capacitor 52a to an IC (not shown), 55b a leader wiring which passes through the through-hole 55a for the by-pass capacitor 52a, and reference characters 56a and 56b denote solder pads on which the by-pass capacitor 52a is installed. Further, in FIGS. 8A and 8B, broken lines denoted by reference characters 57a to 57c indicate wirings in a layer different from a layer in which the by-pass capacitor 52a is incorporated, and also an alternate long and short dash line denoted by reference character 58a indicates a wiring in another layer different from the layer in which the by-pass capacitor 52a is incorporated.

The wiring length calculation section 15d calculates the wiring length (here, leader wiring length) of the wiring 53b which passes through the through-hole 53a disposed at the installation-possible position extracted by the installation-possible position extraction section 15c.

The installation position determination section 15e determines an installation-possible position regarding the shortest wiring length from among the leader wiring lengths calculated by the wiring length calculation section 15d as an installation position for the through-hole 53a. Consequently, the installation position of the through-hole 53a is determined as the position at which the wiring 53b which passes through the through-hole 53a is shortest as illustrated in FIG. 8B.

The processes by the installation-possible position extraction section 15c, wiring length calculation section 15d and installation position determination section 15e are executed at step S3 in FIG. 5 described above where the first wiring processing section 15a executes them, but are executed at step S8 in FIG. 5 described above where the second wiring processing section 15b executes them. In particular, if, after the wiring process by the first wiring processing section 15a or the second wiring processing section 15b is completed in a general way, the optimization process for the leader wiring by the installation-possible position extraction section 15c, wiring length calculation section 15d and installation position determination section 15e is further executed, then the primary wiring process (at step S3 described above) or the secondary wiring process (at step S8 described above) is completed fully.

Figure 9:
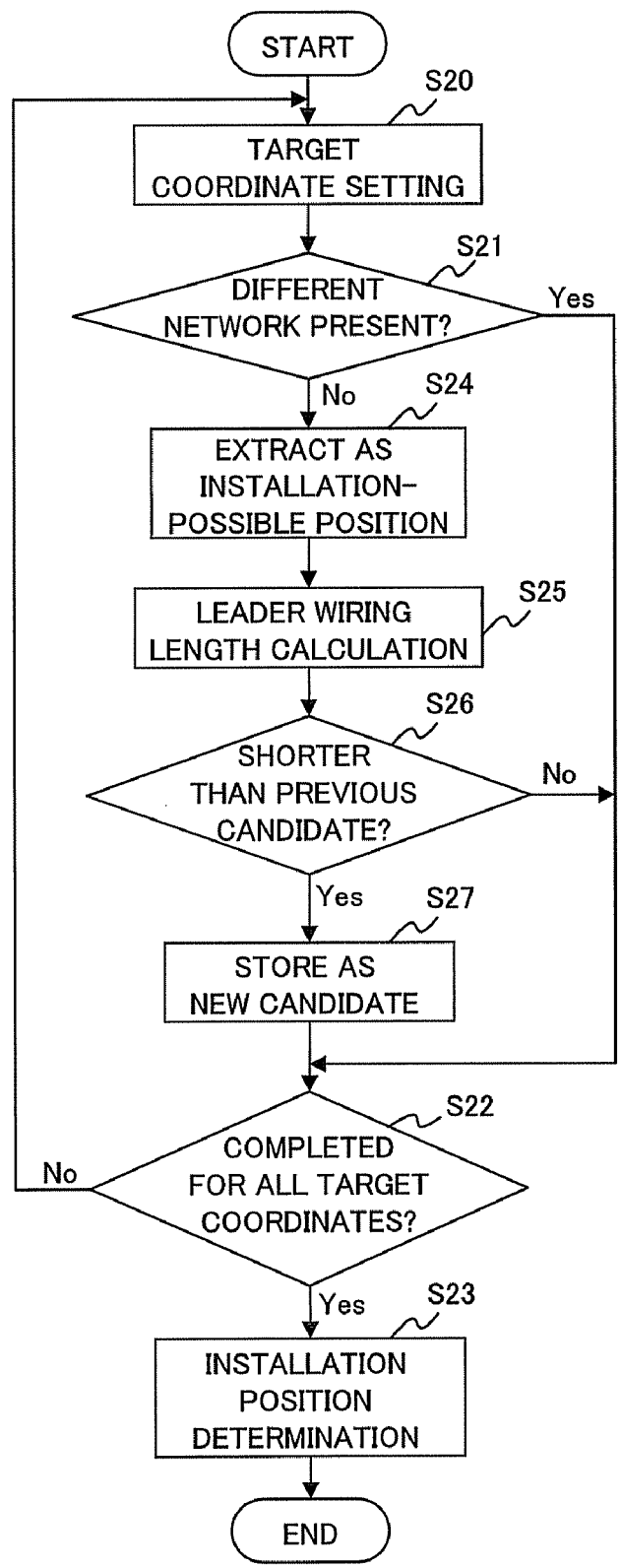
FIG. 9 is a flow chart illustrating an operation procedure of the installation-possible position extraction section, wiring length calculation section and installation position determination section which are included in the first wiring processing section and/or the second wiring processing section of the automatic wiring apparatus according to the embodiment.
Figure 10:
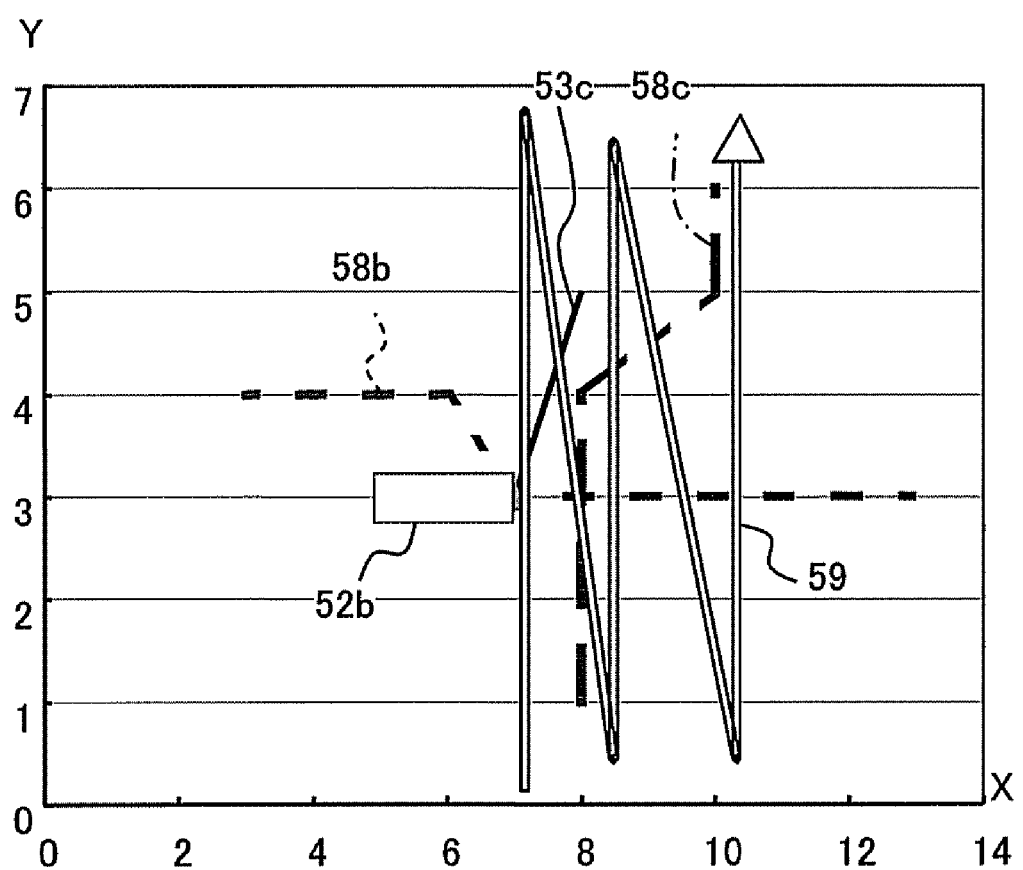
FIG. 10 is a diagrammatic view illustrating the optimization function of the leader wiring for the by-pass capacitor implemented by the installation-possible position extraction section, wiring length calculation section and installation position determination section of the automatic wiring apparatus according to the embodiment.

Here, a particular operation procedure where the wiring length of the leader wiring 53c for a by-pass capacitor 52b illustrated in FIG. 10 is made shortest by the installation-possible position extraction section 15c, wiring length calculation section 15d and installation position determination section 15e is described with reference to a flow chart (steps S20 to S27) illustrated in FIG. 9. It is to be noted that, in FIG. 10, broken lines denoted by reference characters 58b and 58c indicate different wirings in a layer same as or different from a layer in which the leader wiring 53c is provided.

First, the installation-possible position extraction section 15c scans an installation target region for a through-hole in order in a direction indicated by an arrow mark 59 in FIG. 10 to set a target coordinate (step S20), and decides whether or not there is a different net at the set coordinate (including a coordinate in a different layer) (step S21).

Figure 11:
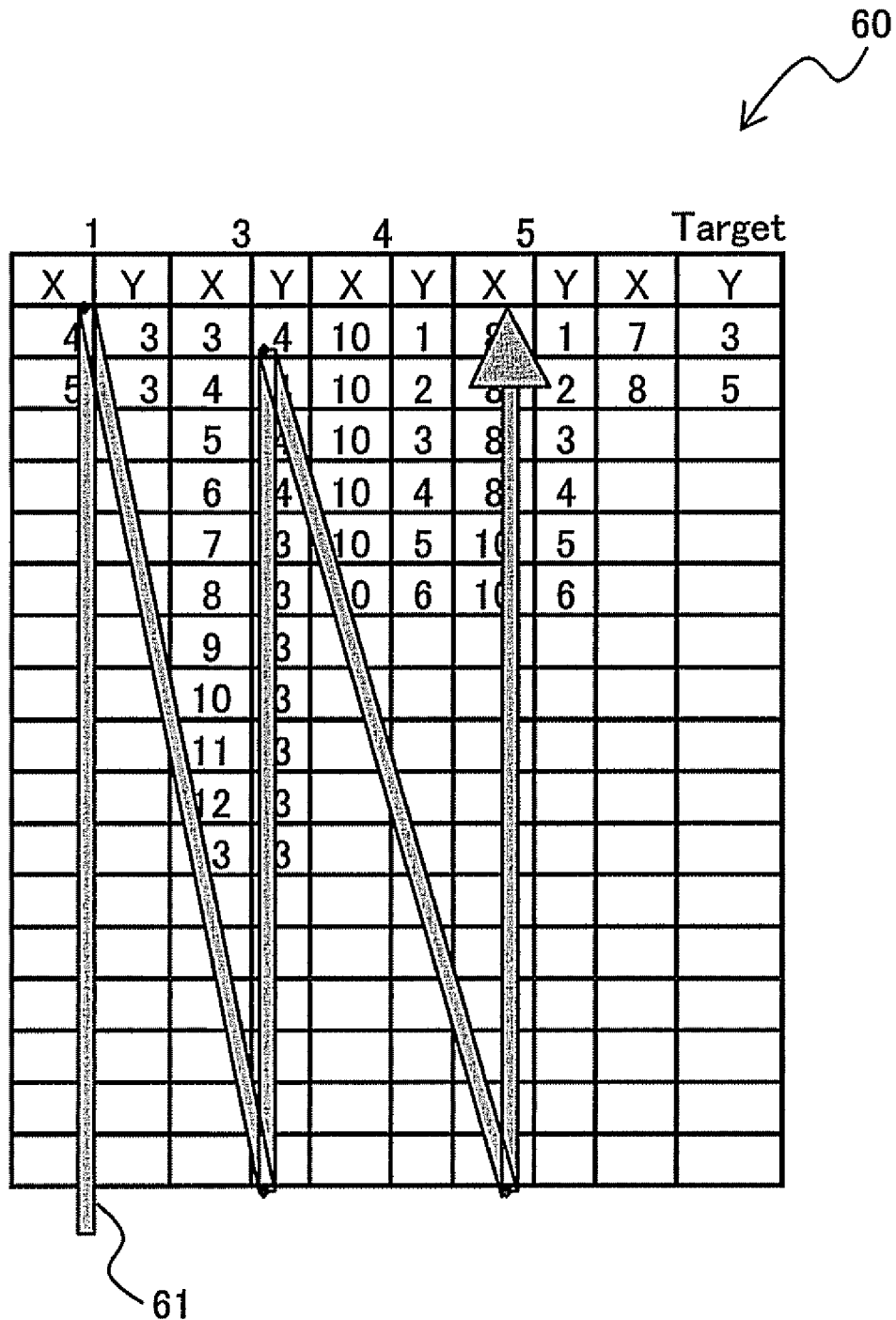
FIG. 11 is a diagrammatic view illustrating a process of the installation-possible position extraction section included in the first wiring processing section and/or the second wiring processing section of the automatic wiring apparatus according to the embodiment.

Here, based on such a table 60 as illustrated in FIG. 11 which indicates coordinates of other nets obtained as a result of the wiring by the first wiring processing section 15a or the second wiring processing section 15b, the installation-possible position extraction section 15c scans for presence of any other net in order in a direction indicated by an arrow mark 61 to execute a decision process at step S21 described above.

Then, if it is decided that there is some other net (Yes route of step S2), then the installation-possible position extraction section 15c skips processes at steps S24 to S27 hereinafter described and decides whether or not the process for all target coordinates in the installation target region for the through-hole is completed (step S22).

Here, if it is decided by the installation-possible position extraction section 15c that the process is not completed for all target coordinates as yet (that is, there remains some target coordinate before the process) (No route of step S22), then the installation-possible position extraction section 15c returns the processing to step S20 described above.

On the other hand, if it is decided by the installation-possible position extraction section 15c that the process is completed for all target coordinates (Yes route of step S22), then the installation position determination section 15e determines an installation position (target coordinate) regarding the shortest wiring length (new candidate recorded at step S27 hereinafter described) from among the calculated wiring lengths as an installation position (step S23) and then ends the processing.

It is to be noted that the situation that the process at step S23 described above is executed in a state wherein the shortest wiring length is not stored signifies that the through-hole cannot be installed in the installation target region.

On the other hand, if it is decided that there is no other net (No route of step S21), then the installation-possible position extraction section 15c extracts the coordinate as an installation-possible position (step S24).

Then, if the installation-possible position is extracted by the installation-possible position extraction section 15c, then the wiring length calculation section 15d calculates a wiring length of the leader wiring 53c where the through-hole is provided at the extracted installation-possible position (step S25).

Then, the installation position determination section 15e decides whether or not the wiring length calculated by the wiring length calculation section 15d is shorter than the shortest wiring length (preceding candidate) from among the formerly calculated wiring lengths (step S26). It is to be noted that, where the wiring length is calculated first by the wiring length calculation section 15d, the process at step S26 is not executed but a process at step S27 hereinafter described is executed.

Then, if it is decided at step S26 described above by the installation position determination section 15e that the wiring length calculated by the wiring length calculation section 15d is longer than the preceding candidate (No route of step S26), then the process at step S27 hereinafter described is skipped and then the process at step S22 by the installation-possible position extraction section 15c is executed.

On the other hand, if it is decided by the installation position determination section 15e that the wiring length calculated by the wiring length calculation section 15d is shorter than the preceding candidate (Yes route of step S26), then the target coordinate is stored as a new candidate (preceding candidate) (step S27) and the process at step S22 is executed. Then, if it is decided by the installation-possible position extraction section 15c that the process is completed for all target coordinates (Yes route of step S22), then the installation position determination section 15e determines the target coordinate as the installation position of the through-hole (step S23).

Accordingly, the installation-possible position at which the leader wiring 53c has the shortest length is determined as the installation position from among all of the coordinates in the installation target region.

In this manner, with the installation-possible position extraction section 15c, wiring length calculation section 15d and installation position determination section 15e, an installation position of a through-hole at which a leader wiring of a by-pass capacitor has the shortest length can be automatically determined, that is, the installation position of the through-hole can be optimized. As a result, the burden on the operator can be decreased significantly in comparison with the conventional technique with which the operator manually changes the installation position of a through-hole, and a noise suppression effect which is an item of an electric characteristic can be enhanced and an IC or the like can be stabilized.

[1-2-3] Noise Amount Calculation Function and Noise Quality Decision Function

Now, a noise amount calculation function implemented by the wiring inductance calculation section 21 and the noise amount calculation section 22 of the present automatic wiring apparatus 1 and a noise quality decision function implemented by the wiring inductance calculation section 21, noise amount calculation section 22 and quality allowability decision section 17 are described.

In recent years, together with increase in scale of an LSI (Large Scale Integration; integrated circuit), the power supply noise amount relating to the LSI is increasing significantly. As a result, optimum disposition of a by-pass capacitor connected to an LSI as a countermeasure against power supply noise has become relatively important in the design quality. In order to extract a noise suppression effect of a by-pass capacitor in the maximum, the wiring length of a leader wiring of the by-pass capacitor must be made as short as possible and the leader wiring must be made as thick as possible as described in the item [1-2-1] above.

However, it is difficult in a printed wiring board in which the wiring density is high to make the wiring length of a leader wiring of a by-pass capacitor short and make the width of a leader wiring thick. Accordingly, it is preferable to determine the position of a through-hole and the width of a leader wiring within a range within which the quality can be allowed based on an actual noise amount.

However, although a technique is conventionally available wherein a noise amount is calculated and quality decision is implemented by a simulation, if a simulation is executed, then since the calculation scale is great and much time is required for the simulation and so forth, calculation of a noise amount and quality decision cannot be incorporated in actual design working (wiring process).

Therefore, in the present automatic wiring apparatus 1, the wiring inductance calculation section 21 and the noise amount calculation section 22 are provided to implement a noise amount calculation function for calculating a noise amount simply based on information obtained from design information. It is to be noted that the calculation of the noise amount and the quality allowance decision regarding the noise amount by the quality allowability decision section 17 are executed at step S10 in FIG. 5 described herein above.

The noise amount increases in proportion to the inductance of the wiring (here, the leader wiring of the by-pass capacitor). Therefore, the wiring inductance calculation section 21 calculates a wiring inductance based on the wiring length of the leader wiring for the by-pass capacitor disposed in the wiring region for which the wiring process is carried out by the second wiring processing section 15b.

In particular, the wiring inductance calculation section 21 calculates a leader wiring inductance L[H] in accordance with an expression (1) given below based on the magnetic permeability μ which is a dielectric characteristic, the inter layer distance D between wiring layers on the printed board, the width (pattern width) w of the leader wiring and the wiring length (leader length) l of the leader wiring.

$$L = \mu \times D / w \times l \quad (1)$$

Figure 12:
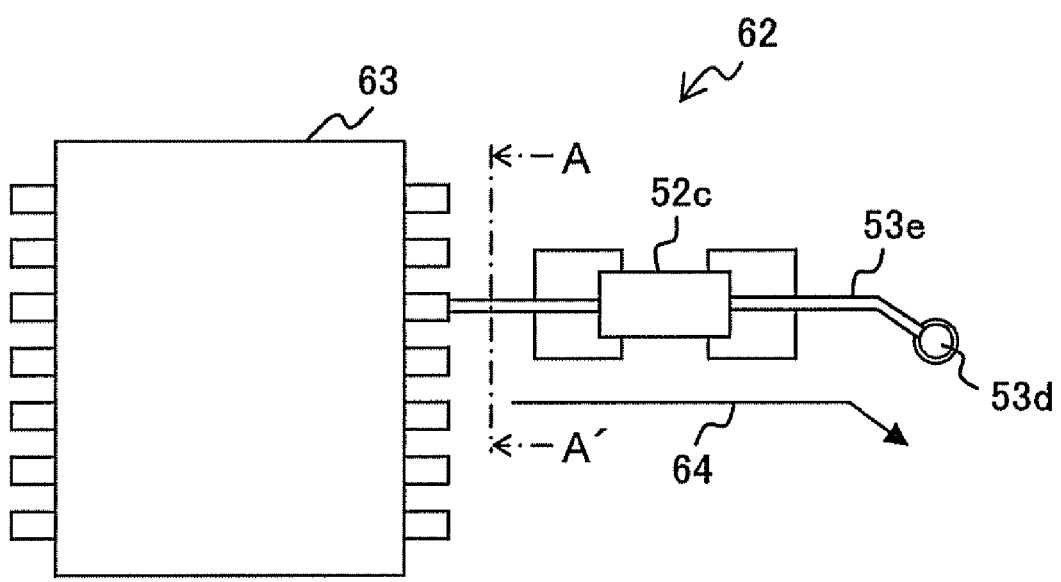
FIG. 12 is a diagrammatic view illustrating a calculation target of a noise amount by a noise amount calculation function implemented by a wiring inductance calculation section and a noise amount calculation section of the automatic wiring apparatus according to the embodiment.

Here, for example, as illustrated in FIG. 12, the wiring length l indicates the length of a leader wiring 53e to a through-hole 53d for connecting a by-pass capacitor 52c connected to an LSI 63 on a printed board 62 to the ground.

Figure 13:
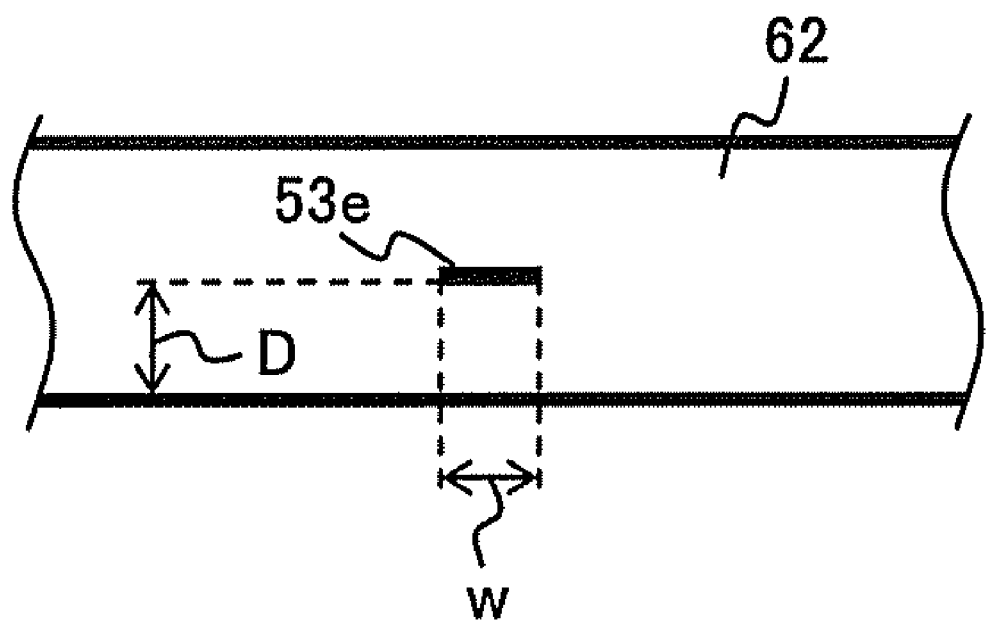
FIG. 13 is an enlarged sectional view of a printed board taking along line A-A' of FIG. 12.

Further, as illustrated in FIG. 13, the magnetic permeability μ is the magnetic permeability of the printed board 62 and the wiring interval w is the pattern width of the leader wiring 53e, and the inter layer distance D is the distance between a layer on which the leader wiring 53e is disposed and another layer (here, a lower layer). It is to be noted that the inter layer distance D, the width w of the leader wiring and the leader length l which individually indicate a physical shape are included as the design information in the result of the wiring by the wiring processing section 15, and the magnetic permeability μ is retained in advance as the design information in the design information retention section 10.

Then, the noise amount calculation section 22 calculates a noise amount S in accordance with an expression (2) given below based on the wiring inductance L calculated by the wiring inductance calculation section 21 and the power consumption variation amount ΔI [V] of the LSI 63 to which the by-pass capacitor 52c is connected.

$$S = L \times \Delta I \quad (2)$$

Here, as illustrated in FIG. 12, the power consumption variation amount ΔI is the power consumption by current flowing from the LSI 63 to the GND through the by-pass capacitor 52c in a direction indicated by an arrow mark 64. It is to be noted that the power consumption variation amount ΔI is registered in advance as a design specification of the LSI 63, for example, in the design information retention section 10.

Further, the quality allowability decision section 17 decides whether or not the quality of the wiring region (for example, the print board 62) can be allowed in accordance with the noise amount S calculated by the noise amount calculation section 22.

More particularly, the quality allowability decision section 17 retains in advance a decision value (upper limit value) for the noise amount S and compares the decision value with the noise amount S calculated by the noise amount calculation section 22. Then, if the noise amount S is lower than the decision value, then it is decided that the quality can be allowed, but, if the noise amount S is higher than the decision value, then it is decided that the quality cannot be allowed.

In this manner, with the wiring inductance calculation section 21 and the noise amount calculation section 22, a noise amount can be easily calculated utilizing the fact that the noise amount increases in proportion to the inductance of a leader wiring, and calculation of the noise amount can be executed in short time.

Further, upon the wiring process, quality decision can be executed by the quality allowability decision section 17 based on the noise amount calculated by the noise amount calculation section 22. As a result, the wiring process wherein the quality relating to the noise amount is satisfied can be executed.

[1-2-4] Check Function of the Design Condition and a Warning Function

Now, a check function of a design condition and a warning function implemented by the device information acquisition section 23, design condition necessity decision section 24, design condition presence decision section 25 and notification section 26 of the present automatic wiring apparatus 1 are described.

While the operator inputs a design condition (mounting instruction) for each part in accordance with a topology (connection form) of connection information of parts (devices), there is no check method for an inputting omission (mounting instruction omission).

Therefore, the present automatic wiring apparatus 1 implements a function for detecting a setting omission of the design condition by decision, by the device information acquisition section 23, design condition necessity decision section 24 and design condition presence decision section 25, based on design information (net list information) retained in the design information retention section 10, regarding whether or not a design condition is set for a net for which a design condition is necessary based on net list information which indicates a connection scheme of devices.

Incidentally, the design condition retained in the design condition retention section 11 of the present automatic wiring apparatus 1 is not limited to such wiring length and wiring interval as described herein above with reference to FIG. 4B. For example, as illustrated in FIG. 14, not only the wiring length and the wiring interval but also, for example, a leader wiring for a by-pass capacitor, a distance from a transmission device to a damping resistor, a distance from a transmission device to a bias resistor, a branching wiring length, a power supply wiring length and a GND wiring length are set as the design condition.

In other words, the leader wiring for the by-pass capacitor, distance from the transmission device to the damping resistor, distance from the transmission device to the bias resistor, branching wiring length, power supply wiring length and GND wiring length are items for which a design condition is to be set and a design condition is necessary.

It is to be noted that particular values of "design condition", "wiring result", "moderation allowability information", "distribution of point" and "marking" are omitted for simplification of FIG. 14.

Here, the leader wiring for the by-pass capacitor indicates a connection wiring length to the through-hole for GND connection of the by-pass capacitor as described herein above with reference to FIGS. 8A, 8B and 10.

Figure 15:
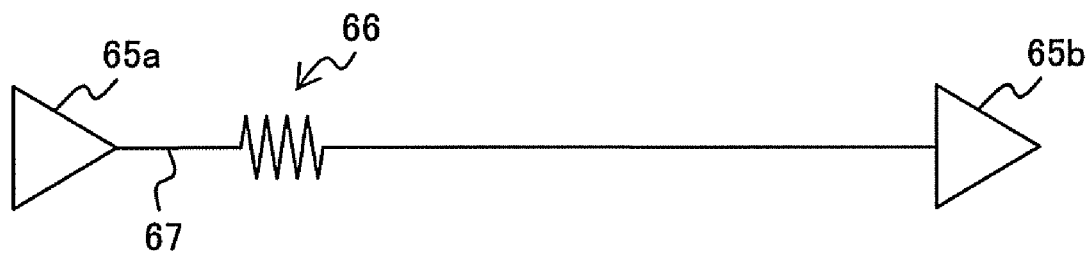
FIG. 15 is a diagrammatic view illustrating a distance from a transmission device to a damping resistor as a design condition retained by the design condition retention section of the automatic wiring apparatus according to the embodiment.

Further, the distance from the transmission device to the damping resistor signifies a wiring length of a connection wiring 67 between a transmission device 65a and a damping resistor 66 provided between the transmission device 65a and a reception device 65b as illustrated in FIG. 15.

Figure 16:
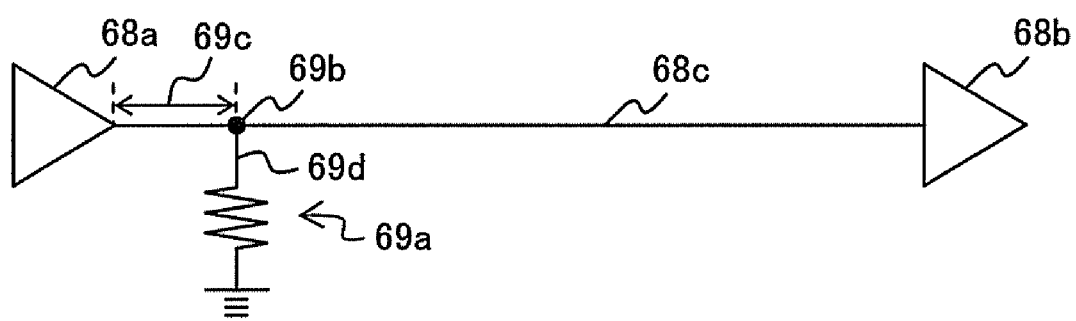
FIG. 16 is a similar view but illustrating a distance from a transmission device to a bias resistor and a branching wiring length as a design condition retained in the design condition retention section of the automatic wiring apparatus according to the embodiment.

Further, the distance from the transmission device to the bias resistor indicates a distances 69c from a transmission device 68a to a connection point 69b of a bias resistor 69a on a connection wiring 68c between the transmission device 68a and a reception device 68b as illustrated in FIG. 16.

Further, the branching wiring length indicates a wiring length of a connection wiring 69d for connecting the connection point (branching point) 69b and the bias resistor 69a to each other as illustrated in FIG. 16.

Figure 17:
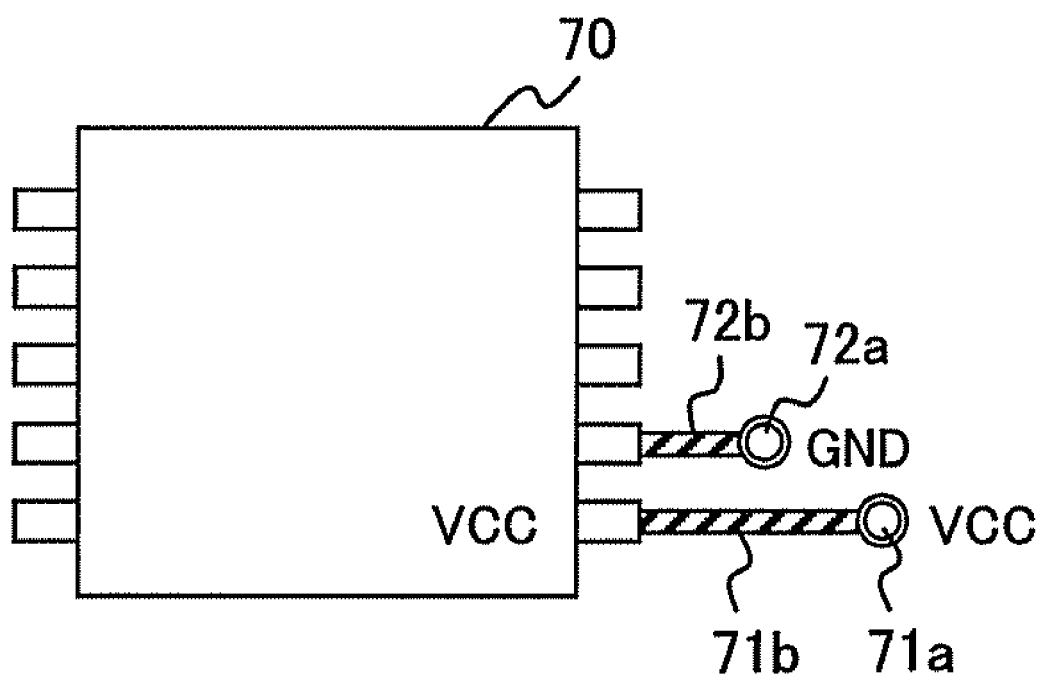
FIG. 17 is a schematic view illustrating a power supply wiring length and a ground wiring length as a design condition retained in the design condition retention section of the automatic wiring apparatus according to the embodiment.

It is to be noted that, as illustrated in FIG. 17, the power supply wiring length signifies a wiring length of a connection wiring 71b between an IC 70 and a via hole 71a for connection to a power supply (VCC), and the GND wiring length signifies a wiring length of a connection wiring 72b between the IC 70 and a via hole 72a for connection to the ground.

Accordingly, the device information acquisition section 23, design condition necessity decision section 24 and design condition presence decision section 25 check whether or not a design condition is set (particularly, whether or not a corresponding design condition is retained in the design condition retention section 11) regarding the leader wiring length for the by-pass capacitor, the distance from the transmission device to the damping resistor, the distance from the transmission device to the bias resistor, the branching wiring length, the power supply wiring length and the GND wiring length for which setting of the design condition is required.

In particular, the device information acquisition section 23 first acquires information of a device to be connected to a net based on a net list (net list information) as the design information retained in the design information retention section 10.

In particular, the device information of all nets included in the net list is acquired.

Figures 18A, 18B, 18C, 18D:
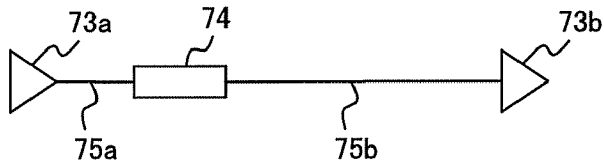

For example, the device information acquisition section 23 acquires, as illustrated in FIG. 18A, device information regarding a transmission device 73a, a connection line (net) 75a to a damping resistor 74 connected between the transmission device 73a and a reception device 73b and a net 75b between the damping resistor 74 and the reception device 73b as illustrated in FIG. 18B.

In particular, the device information acquisition section 23 acquires device information that the transmission device and the resistor are connected to the net 75a, and acquires device information that the resistor and the reception device are connected to the net 75b.

Then, the design condition necessity decision section 24 decides whether or not the design condition is necessary for the corresponding nets 75a and 75b based on the device information acquired by the device information acquisition section 23.

For example, as illustrated in FIG. 18C, the design condition necessity decision section 24 checks whether or not a transmission device, a reception device and a resistor are connected to each of the nets 75a and 75b (in FIG. 18C, a connection state is indicated by "o" but a non-connection state is indicated by "X"), and decides that a design condition is necessary for the net 75a to which both of a transmission device and a resistor are connected (indicated by "necessary" in FIG. 18C) but decides that a design condition is necessary for the other net 75b (indicated by "unnecessary" in FIG. 18C).

Then, the design condition presence decision section 25 decides whether or not a design condition is set for the net 75a for which it is decided by the design condition necessity decision section 24 that the design condition is necessary.

Here, as illustrated in FIG. 18D, the design condition retention section 11 retains information (mounting instruction flag) which indicates whether or not a design condition is retained for each of the nets 75a and 75b and a particular design condition, and manages (sets) a design condition for each net using the mounting instruction flag and an actual value of the design condition. It is to be noted that, in the example of FIG. 18D, the mounting instruction flags regarding the nets 75a and 75b indicate the design condition "No" and actual values of the design conditions corresponding to the nets 75a and 75b are not retained.

Accordingly, the design condition presence decision section 25 decides presence or absence of setting of a design condition for the net 75a, for which it is decided by the design condition necessity decision section 24 that the design condition is necessary, based on the mounting instruction flag of the net 75a retained in the design condition retention section 11. Here, since the mounting instruction flag of the net 75a indicates that a design condition is not retained (indicated by "No" in FIG. 18D), the design condition presence decision section 25 decides that a design condition for the net 75a is not set.

In this manner, a setting omission of a design condition for the net 75a for which the design condition is necessary is checked by the device information acquisition section 23, design condition necessity decision section 24 and design condition presence decision section 25.

It is to be noted that the design condition necessity decision section 24 decides the necessity for a design condition regarding the leader wiring of the by-pass capacitor in response to whether or not the by-pass capacitor and the via hole for connection to the ground are connected to the net, and decides the necessity for a design condition regarding the distance from the transmission device to the bias resistor in response to whether or not the transmission device and the bias resistor are connected to the net. Further, the design condition necessity decision section 24 decides the necessity for a design condition regarding the branching wiring length in response to whether or not connection to a connection point (or a different wiring) and a resistor is carried out with respect to the net, and decides the necessity for a design condition regarding the power supply wiring length in response to whether or not a power supply terminal of the IC and a via hole for connection to the power supply are connected to the net. Further, the design condition necessity decision section 24 decides the necessity for a design condition regarding the ground wiring length in response to whether or not the IC and a via hole for connection to the ground are connected to the net.

Further, where it is decided by the design condition presence decision section 25 that a design condition is not set to the net 75a, the notification section 26 issues a notification of the decision result to the outside (operator), for example, through the monitor 31. It is to be noted that, at this time, in the table illustrated in FIG. 18C, the item indicating presence of warning of the net 75a indicates "Yes" but the item indicating presence of warning of the net 75b indicates "No".

Figure 19:
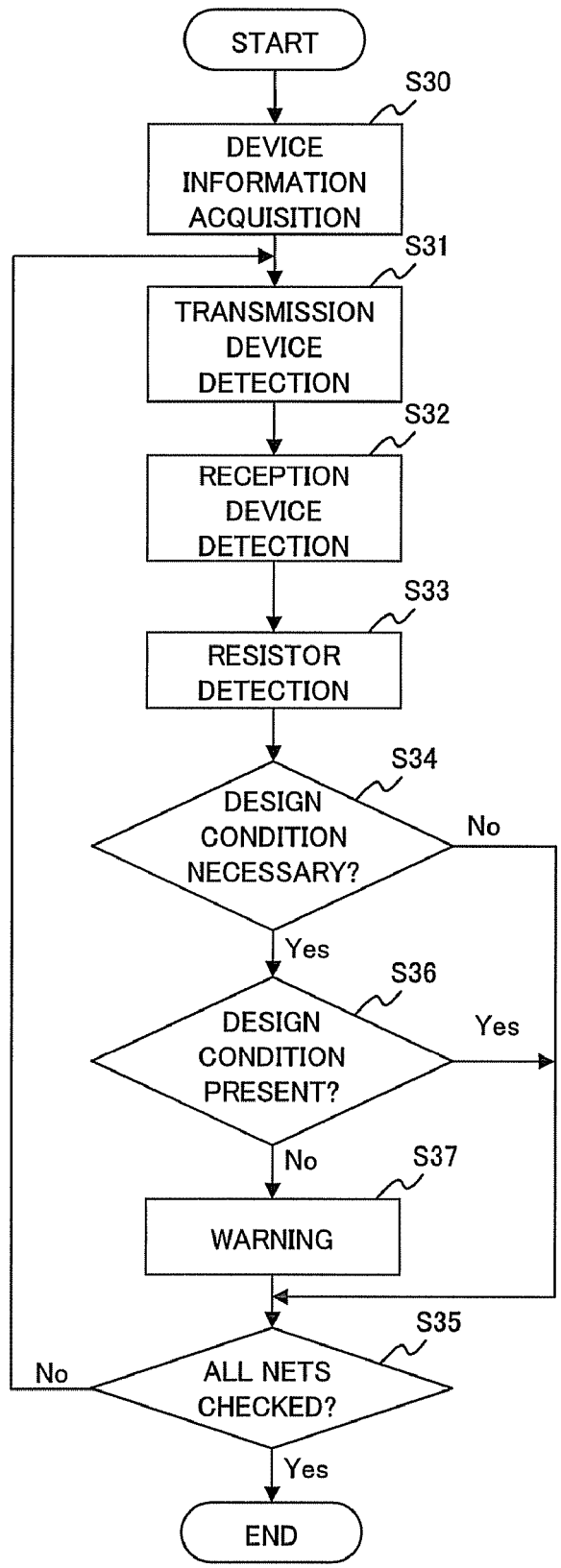
FIG. 19 is a flow chart illustrating an operation procedure of the device information acquisition section, design condition necessity decision section, design condition presence decision section and notification section of the automatic wiring apparatus according to the embodiment.

Now, a particular operation procedure of the device information acquisition section 23, design condition necessity decision section 24, design condition presence decision section 25 and notification section 26 of the automatic wiring apparatus 1 is described with reference to a flow chart (steps S30 to S37) illustrated in FIG. 19. It is to be noted that checking of the design condition and warning operation illustrated in FIG. 19 are executed at step S2 in FIG. 5 described above.

First, the device information acquisition section 23 acquires a net list as the device information from the design information retention section 10 (step S30), and then the design condition necessity decision section 24 decides whether or not the design condition is necessary for a net in the net list (steps S31 to S34). Here, it is decided, in response to whether or not the damping resistor and the transmission device are connected to the net, whether or not a design condition regarding the distance from the transmission device to the damping resistor is set. It is to be noted that, as described above, preferably it is decided also regarding the other items illustrated in FIG. 14 whether or not a design condition is set at steps S31 to S34.

In particular, the design condition necessity decision section 24 decides whether or not a transmission device is connected to the net (transmission device detection; step S31), whether or not a reception device is connected to the net (reception device detection; step S32) and whether or not a resistor (here, damping resistor) is connected to the net (resistor detection; step S33), and then decides whether or not a design condition is necessary for the net in accordance with the results of the decision (step S34).

Here, if the design condition necessity decision section 24 decides that the transmission device and the resistor are not connected to the net and a design condition for the net is unnecessary (No route of step S34), then the processing for the net is ended (processes at steps S36 and S37 hereinafter described are skipped) and it is decided whether or not checking for all nets acquired at step S30 described above ends (step S35). Then, if it is decided that the checking for all nets ends (Yes route of step S35), then the processing is ended.

On the other hand, if the design condition necessity decision section 24 decides that the checking for all nets does not end (No route of step S35), then the processing returns to the process at step S31 in order to execute the process for a next net.

Further, if the design condition necessity decision section 24 decides at step S34 that a transmission device and a resistor are connected to the net and a design condition is necessary for the net (Yes route of step S34), then the design condition presence decision section 25 decides whether or not a design condition for the net is set based on a mounting instruction flag (step S36).

Here, if the design condition presence decision section 25 decides that a design information for the net is set (Yes route of step S36), then the processing advances to the process at step S35 described above.

On the other hand, if the design condition presence decision section 25 decides that a design information for the net is not set (No route of step S36), then the notification section 26 issues a notification of the decision result to the outside (operator) and then issues warning (step S37), and the processing advances to a process at step S35.

In this manner, with the device information acquisition section 23, design condition necessity decision section 24, design condition presence decision section 25 and notification section 26, where a setting omission of the design condition is found from a net for which a design condition is necessary, a setting omission can be detected with certainty and a notification (warning) of the setting omission can be issued to the operator. Further, quality degradation by a design condition omission can be prevented and a wiring process which satisfies desired quality can be executed with certainty.

[1-2-5] Checking Function of the Design Condition and the Design Condition Setting Function Now, a checking function of a design condition and a design condition setting function implemented by the device information acquisition section 23, design condition necessity decision section 24, design condition presence decision section 25 and design condition setting section 27 of the present automatic wiring apparatus 1 are described.

The checking function of a design condition by the device information acquisition section 23, design condition necessity decision section 24 and design condition presence decision section 25 is similar to that described above, and the design condition setting function is implemented by automatically setting a design condition by means of the design condition setting section 27 for a net for which a design condition is necessary but is not set.

In particular, a setting process of a design condition by the design condition setting section 27 is executed in place of the notification process by the notification section 26 at step S37 of FIG. 9 described above.

Where it is decided by the design condition presence decision section 25 that a design condition is not set for a net for which a design condition is necessary, the design condition setting section 27 sets a design condition for the net. In particular, the design condition setting section 27 decides a design condition (particularly, some of a wiring length, a wiring interval, a leader wiring length of a by-pass capacitor, a distance from a transmission device to a damping resistor, a distance from a transmission device to a bias resistor, a branching wiring length, a power supply wiring length and a ground wiring length) to be set in response to a device connected to the net and then sets a value set in advance in accordance with the design condition to be set as the design condition.

Further, where a transmission speed between parts connected to the net is included in the design information (net list) as in the design condition production section 20 described above, the design condition setting section 27 sets a wiring length and a wiring interval between the parts based on the conversion table 20a.

In this manner, with the design condition setting section 27, a setting condition can be automatically set for a net for which, while a design condition is necessary, a design condition is not set. Therefore, the burden on the operator can be decreased significantly and quality degradation by a design condition omission can be suppressed, and the wiring process which satisfies desired quality can be executed with certainty.

[1-3] Effect by Automatic Wiring Apparatus 1

As described above, with the automatic wiring apparatus 1 (automatic wiring method) as the embodiment of the present invention, where the wiring process (first wiring processing step) which satisfies the design condition cannot be carried out by the first wiring processing section 15a, the design condition changing section 16 changes the design condition in accordance with the priority information regarding the design condition (design condition changing step). Where the wiring process (second wiring processing step) which satisfies the design condition after the changing can be executed by the second wiring processing section 15b and it is decided (quality allowance decision step) by the quality allowability decision section 17 that the quality of the wiring region for which the wiring process is carried out by the second wiring processing section 15b can be allowed, the outputting section 18 outputs a result of the wiring process of the wiring region by the second wiring processing section 15b (outputting step). Consequently, the wiring process which satisfies the design condition and satisfies the design quality regarding the electric characteristic can be automatically executed.

Further, since the design condition changing section 16 changes the design condition in accordance with the priority information regarding the design condition, by suitably setting the priority information (particularly, by setting the priority information such that the design condition is changed from an item in which the degree of an influence on electric characteristic quality is low), the wiring process can be carried out while moderating the design condition such that significant degradation of the electric characteristic quality is prevented and the automatic wiring process which satisfies desired design quality can be executed with a higher degree of certainty.

Further, where the wiring process which satisfies the design condition after the changing cannot be executed by the second wiring processing section 15b, the design condition changing section 16 further changes the design condition after the changing in accordance with the priority information (first design condition re-changing step), and, where the design condition after the changing is further changed by the design condition changing section 16, the second wiring processing section 15b carries out the wiring process of the wiring region based on the further changed design condition (re-wiring processing step). Therefore, the wiring process can be executed after the design condition is changed by a plural number of times, and the automatic wiring process which satisfies the desired design quality can be executed with a higher degree of certainty.

It is to be noted that, if it is decided by the quality allowability decision section 17 that the quality of the wiring region cannot be allowed, then the priority information re-setting section 19 re-sets the priority information (priority information re-setting step) and the design condition changing section 16 changes the design condition in accordance with the re-set priority information (second design condition re-changing step). Also where the wiring process which satisfies the quality cannot be executed with the priority information at first, the wiring process can be continued after the priority information is changed without causing the processing to end, and the automatic wiring process which satisfies desired design quality can be executed with a higher degree of certainty.

Further, since the quality allowability decision section 17 decides whether or not the quality of the wiring region can be allowed based on the design condition and a result of the wiring process in accordance with the design condition after the changing by the second wiring processing section 15b, allowance or rejection of the quality relating to the electric characteristic based on the design condition can be decided accurately.

More particularly, the quality allowability decision section 17 decides whether or not the quality of the wiring region can be allowed based on a decision value calculated based on a reference value as the priority information set in advance for each item of the design condition and a result of the wiring process by the second wiring processing section 15b. Therefore, allowance or rejection of the quality relating to the electric characteristic of the wiring region can be decided very easily and with certainty, and as a result, the automatic wiring process which satisfies the design condition and the design quality can be executed with a higher degree of certainty.

Further, the design condition production section 20 produces a design condition based on the conversion table indicating a corresponding relationship between a transmission speed of a signal between parts disposed in the wiring region and the design condition. Therefore, the design condition can be automatically produced in response to the transmission speed between the parts and the burden on the operator can be decreased significantly, and an inputting error by the operator can be eliminated. Consequently, the automatic wiring process which satisfies the design quality can be executed with a higher degree of certainty.

Further, at least one of the first wiring processing section 15a and the second wiring processing section 15b includes the installation-possible position extraction section 15c for extracting an installation-possible position in the wiring region for a through-hole disposed in the wiring region, the wiring length calculation section 15d for calculating a wiring length of a wiring which passes through the through-hole installed at the installation-possible position extracted by the installation-possible position extraction section 15c and the installation position determination section 15e for determining the installation-possible position for the shortest wiring length from among the wiring lengths calculated by the wiring length calculation section 15d as an installation position of the through-hole. Therefore, the installation position of the through-hole with which the wiring length of the wiring which passes through the through-hole is shortest can be automatically determined, that is, the installation position of the through-hole can be optimized, and as a result, the burden on the operator can be decreased significantly in comparison with the conventional technique wherein the installation position of the through-hole is changed manually by the operator. Further, by optimizing the wiring length regarding the bypass capacitor, a noise suppression effect which is an item of the electric characteristic can be enhanced and an IC or the like can be stabilized.

It is to be noted that the noise amount calculation section 22 calculates a noise amount based on a wiring inductance calculated by the wiring inductance calculation section 21 and a power consumption variation amount of an integrated circuit and the quality allowability decision section 17 decides whether or not the quality of the wiring region can be allowed in accordance with the noise amount. Therefore, the noise amount which cannot conventionally be taken into consideration at a stage of the design because much time is required for the calculation can be taken into consideration at a stage of the wiring process, and re-carrying out of the wiring process when the quality regarding the noise amount is not satisfied after the design does not occur. Further, decision of the design quality with high accuracy taking the noise amount into consideration can be implemented and the automatic wiring process which satisfies the desired quality can be executed with a higher degree of certainty.

Further, the device information acquisition section 23 acquires information of devices connected to the net based on the net list information as the design information and the design condition necessity decision section 24 decides whether or not a design condition is necessary for the net based on the device information, and the design condition presence decision section 25 decides whether or not a design condition is set for the net for which it is decided by the design condition necessary decision section 24 that a design condition is necessary and then the notification section 26 issues, where it is decided by the design condition presence decision section 25 that a design condition is not set for the net, a notification of the decision result. Therefore, it is possible to decide whether or not there is setting omission of a design condition for the net for which a design condition is necessary and then detect the setting omission with certainty such that a notification (warning) of a result of the detection is issued to the operator. Consequently, quality degradation of the wiring process by the design condition omission can be suppressed, and as a result, the wiring process which satisfies the desired quality can be executed with certainty.

Further, the design condition setting section 27 sets a design condition for the net where it is decided by the design condition presence decision section 25 that a design condition is not set for the net. Therefore, a design condition can be automatically set for the net for which, while a design condition is necessary, a design condition is not set, and the burden on the operator can be decreased significantly. Further, quality degradation by the design condition omission can be suppressed and the automatic wiring process which satisfies desired quality can be executed with certainty.

It is to be noted that the design condition changing section 16 moderates the design condition stepwise based on allowance contents in accordance with the priority information. Therefore, the wiring process can be executed while the quality regarding the electric characteristic is degraded stepwise, and the wiring process can be completed while the quality is maintained as much as possible.

[2] Others

The present invention is not limited to the embodiment specifically described above, and variations and modifications can be made without departing from the scope of the embodiment.

Further, while the present invention is described taking it as an example in the foregoing description of the embodiment that the priority information retained in the priority information retention section 12 is moderation allowability information or distribution of points, the present invention is not limited to this. The priority information retention section 12 may retain, as the priority information, information indicative of priority ranking (order) when the design condition is moderated together with the moderation allowability information and the distribution of points or in place of the moderation allowability information.

In this instance, the design condition changing section 16 moderates the design condition in accordance with an item order according to the priority order and then carries out condition moderation of a next item according to the priority order where moderation contents of the item come to the last. Consequently, a working effect similar to that of the embodiment described above can be obtained.

Further, in this instance, the priority information re-setting section 19 may be configured such that it changes the priority order, and a working effect similar to that of the embodiment described above can be obtained also in this case.

It is to be noted that the functions as the wiring region information setting section 13, priority information setting section 14, wiring processing section 15, design condition changing section 16, quality allowability decision section 17, outputting section 18, priority information re-setting section 19, design condition production section 20, wiring inductance calculation section 21, noise amount calculation section 22, device information acquisition section 23, design condition necessity decision section 24, design condition presence decision section 25, notification section 26 and design condition setting section 27 may be implemented by executing a predetermined application program (automatic wiring program) by means of a computer (including a CPU, an information processing apparatus and various terminals).

The program is provided in a form wherein it is recorded on a computer-readable recording medium such as, for example, a flexible disk, a CD (CD-ROM, CD-R, CD-RW or the like), a DVD (DVD-ROM, DVD-RAM, DVD-R, DVD-RW, DVD+R, DVD+RW or the like) or the like. In this instance, a computer reads in the automatic wiring program from the recording medium and transfers and stores the program to and into an internal storage apparatus or an external storage apparatus and then uses the program. Further, the program may be recorded in advance, for example, on a storage apparatus (recording medium) such as a magnetic disk, an optical disk, a magneto-optical disk or the like, and the program may be provided from the storage apparatus to the computer through a communication line.

Here, the computer signifies a concept including hardware and an OS (operating system) and signifies hardware which operates under the control of the OS. Further, where an OS is unnecessary and hardware is operated singly with an application program, the hardware itself corresponds to the computer. The hardware includes at least a microprocessor such as a CPU and a means for reading in the computer program recorded on the recording medium.

The application program as the automatic wiring program described above includes program codes for causing such a computer as described above to implement the functions as the wiring region information setting section 13, priority information setting section 14, wiring processing section 15, design condition changing section 16, quality allowability decision section 17, outputting section 18, priority information re-setting section 19, design condition production section 20, wiring inductance calculation section 21, noise amount calculation section 22, device information acquisition section 23, design condition necessity decision section 24, design condition presence decision section 25, notification section 26 and design condition setting section 27. Further, part of the functions may be implemented not by the application program but by the OS.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments have been described in detail, it should be understood that the various changes, substitutions, and alterations could be made hereto without departing from the spirit and scope of the invention.

What is claims is:

1. An automatic wiring apparatus for automatically carrying out a wiring process of a wiring region of a wiring design target based on design information and a design condition of the wiring region, comprising:
    a first wiring processing section adapted to carry out a wiring process of the wiring region based on the design information and the design condition;
    a design condition changing section adapted to change the design condition in response to priority information regarding the design condition where a wiring process which satisfies the design condition cannot be carried out by the first wiring processing section;
    a second wiring processing section adapted to carry out a wiring process of the wiring region based on the design information and the design condition after the changing by the design condition changing section;
    a quality allowability decision section adapted to decide whether or not quality of the wiring region is allowable where a wiring process which satisfies the design condition after the changing can be executed by the second wiring processing section; and
    an outputting section adapted to output a result of the wiring process of the wiring region by the second wiring processing section where it is decided by the quality allowability decision section that the quality of the wiring region is allowable.

2. The automatic wiring apparatus according to claim 1, wherein the design condition changing section further changes the design condition after the changing in accordance with the priority information where the wiring process which satisfies the design condition after the changing cannot be executed by the second wiring processing section, and
    the second wiring processing section carries out, where the design condition after the changing is further changed by the design condition changing section, the wiring process of the wiring region based on the further changed design condition.

3. The automatic wiring apparatus according to claim 1, further comprising:
    a priority information re-setting section adapted to re-set the priority information where it is decided by the quality allowability decision section that the quality of the wiring region is not allowable; and wherein
    the design condition changing section changes the design condition in accordance with the priority information re-set by the priority information re-setting section.

4. The automatic wiring apparatus according to claim 1, wherein the quality allowability decision section decides whether or not the quality of the wiring region is allowable based on the design condition and a result of the wiring process by the second wiring processing section in accordance with the design condition after the changing.

5. The automatic wiring apparatus according to claim 4, wherein the quality allowability decision section decides whether or not the quality of the wiring region is allowable based on a decision value calculated based on a reference value as the priority information set in advance for each item of the design condition and the result of the wiring process by the second wiring processing section.

6. The automatic wiring apparatus according to claim 1, further comprising a design condition production section adapted to produce the design condition based on a conversion table which indicates a corresponding relationship between a transmission speed of a signal between parts disposed in the wiring region and the design condition.

7. The automatic wiring apparatus according to claim 1, wherein at least one of the first wiring processing section and the second wiring processing section includes:
    an installation-possible position extraction section adapted to extract installation-possible positions, in the wiring region, for a through-hole to be disposed in the wiring region;
    a wiring length calculation section adapted to calculate a wiring length of a wiring which passes through the through-hole provided at each of the installation-possible positions extracted by the installation-possible position extraction section; and
    an installation position determination section adapted to determine, as the installation position for the through-hole, the installation-possible position relating to the shortest wiring length from among the wiring lengths calculated by the wiring length calculation section.

8. The automatic wiring apparatus according to claim 1, further comprising:
    a wiring inductance calculation section adapted to calculate wiring inductance based on a wiring length of a wiring relating to a by-pass capacitor disposed in the wiring region for which the wiring process is carried out by the second wiring processing section; and
    a noise amount calculation section adapted to calculate a noise amount based on the wiring inductance calculated by the wiring inductance calculation section and a power consumption variation amount of an integrated circuit; and wherein
    the quality allowability decision section decides whether or not the quality of the wiring region is allowable in response to the noise amount calculated by the noise amount calculation section.

9. The automatic wiring apparatus according to claim 1, further comprising:
    a device information acquisition section adapted to acquire device information of a device connected to a net based on net list information as the design information;
    a design condition necessity decision section adapted to decide whether or not the design condition is necessary for the net based on the device information acquired by the device information acquisition section;
    a design condition presence decision section adapted to decide whether or not the design condition is set for the net for which it is decided by the design condition necessity decision section that the design condition is necessary; and
    a notification section adapted to issue, where it is decided by the design condition presence decision section that no design condition is set for the net, a notification of the decision.

10. The automatic wiring apparatus according to claim 1, further comprising:
- a device information acquisition section adapted to acquire device information of a device connected to a net based on net list information as the design information;
- a design condition necessity decision section adapted to decide whether or not the design condition is necessary for the net based on the device information acquired by the device information acquisition section;
- a design condition presence decision section adapted to decide whether or not the design condition is set for the net for which it is decided by the design condition necessity decision section that the design condition is necessary; and
- a design condition setting section adapted to set, where it is decided by the design condition presence decision section that no design condition is set for the net, the design condition for the net.

11. The automatic wiring apparatus according to claim 1, further comprising a wiring region information setting section adapted to set wiring region information relating to the wiring region as the design information.

12. The automatic wiring apparatus according to claim 1, further comprising a priority information setting section adapted to set the priority information.

13. The automatic wiring apparatus according to claim 1, wherein the design condition changing section moderates the design condition stepwise in accordance with the priority information.

14. An automatic wiring method on a processor for automatically carrying out a wiring process of a wiring region of a wiring design target based on design information and a design condition of the wiring region, comprising:
- a first wiring processing step of carrying out a wiring process of the wiring region based on the design information and the design condition;
- a design condition changing step of changing the design condition in response to priority information regarding the design condition where a wiring process which satisfies the design condition cannot be carried out at the first wiring processing step;
- a second wiring processing step of carrying out a wiring process of the wiring region based on the design information and the design condition after the changing at the design condition changing step;
- a quality allowability decision step of deciding whether or not quality of the wiring region is allowable where a wiring process which satisfies the design condition after the changing can be executed at the second wiring processing step; and
- an outputting step of outputting a result of the wiring process of the wiring region at the second wiring processing step where it is decided at the quality allowability decision step that the quality of the wiring region is allowable.

15. The automatic wiring method according to claim 14, further comprising:
- a first design condition re-changing step of further changing the design condition after the changing at the design condition changing step in accordance with the priority information where the wiring process which satisfies the design condition after the changing cannot be executed at the second wiring processing step; and
- a re-wiring processing step of carrying out, where the design condition after the changing is further changed at the design condition re-changing step, the wiring process of the wiring region based on the further changed design condition.

16. The automatic wiring method according to claim 14, further comprising:
- a priority information re-setting step of re-setting the priority information where it is decided at the quality allowability decision step that the quality of the wiring region is not allowable; and
- a second design condition re-changing step of changing the design condition in accordance with the priority information re-set at the priority information re-setting step.

17. The automatic wiring method according to claim 14, wherein, at the quality allowability decision step, it is decided whether or not the quality of the wiring region is allowable based on the design condition and a result of the wiring process at the second wiring processing step in accordance with the design condition after the changing.

18. The automatic wiring method according to claim 17, wherein, at the quality allowability decision step, it is decided whether or not the quality of the wiring region is allowable based on a decision value calculated based on a reference value as the priority information set in advance for each item of the design condition and the result of the wiring process at the second wiring processing step.

19. A non-transitory computer-readable recording medium on which an automatic wiring program for causing a computer to implement a function for automatically carrying out a wiring process of a wiring region of a wiring design target based on design information and a design condition of the wiring region, the automatic wiring program causing the computer to function as:
- a first wiring processing section adapted to carry out a wiring process of the wiring region based on the design information and the design condition;
- a design condition changing section adapted to change the design condition in response to priority information regarding the design condition where a wiring process which satisfies the design condition cannot be carried out by the first wiring processing section;
- a second wiring processing section adapted to carry out a wiring process of the wiring region based on the design information and the design condition after the changing by the design condition changing section;
- a quality allowability decision section adapted to decide whether or not quality of the wiring region is allowable where a wiring process which satisfies the design condition after the changing can be executed by the second wiring processing section; and
- an outputting section adapted to output a result of the wiring process of the wiring region by the second wiring processing section where it is decided by the quality allowability decision section that the quality of the wiring region is allowable.

* * * * *